United States Patent
Yoon et al.

(10) Patent No.: US 7,031,362 B2
(45) Date of Patent: Apr. 18, 2006

(54) SEMICONDUCTOR LASER DEVICE AND SEMICONDUCTOR LASER MODULE USING THE DEVICE AND METHOD FOR LOW REFLECTIVITY

(75) Inventors: Young Duk Yoon, Tokyo (JP); Sakiko Sugihara, Tokyo (JP); Naoki Tsukiji, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/286,462

(22) Filed: Oct. 31, 2002

(65) Prior Publication Data

US 2003/0108076 A1 Jun. 12, 2003

(30) Foreign Application Priority Data

Nov. 1, 2001 (JP) .................................. 2001-337025
Aug. 23, 2002 (JP) .................................. 2002-244277

(51) Int. Cl.
*H01S 5/00* (2006.01)

(52) U.S. Cl. ............................................ 372/45; 372/49
(58) Field of Classification Search .................. 372/45, 372/49, 46, 48, 54
See application file for complete search history.

(56) References Cited

U.S. PATENT DOCUMENTS 4,731,792 A * 3/1988 Shimizu et al. ............... 372/49
5,056,099 A * 10/1991 Bradley ......................... 372/49
5,228,047 A * 7/1993 Matsumoto et al. .......... 372/45
6,249,534 B1 * 6/2001 Itoh et al. ..................... 372/49
6,396,864 B1 * 5/2002 O'Brien et al. ............... 372/49
6,438,150 B1 * 8/2002 Yoo ............................. 372/49
2002/0048300 A1 * 4/2002 Tsukiji et al. ................ 372/43
2002/0110161 A1 * 8/2002 Yoshida et al. ......... 372/29.021
2002/0136254 A1 * 9/2002 Yoshida et al. ............... 372/45

FOREIGN PATENT DOCUMENTS

| JP | 61-207091 | 9/1986 |
|---|---|---|
| JP | 63-040389 | 2/1988 |
| JP | 63-213389 | 9/1988 |
| JP | 64-042880 | 2/1989 |
| JP | 03-119781 | 5/1991 |
| JP | 04-333834 | 11/1992 |
| JP | 05-095161 | 4/1993 |
| JP | 05-095162 | 4/1993 |
| JP | 05-102597 | 4/1993 |
| JP | 05-243689 | 9/1993 |
| JP | 08-139406 | 5/1996 |

* cited by examiner

*Primary Examiner*—Wilson Lee
*Assistant Examiner*—Hung Tran Vy
(74) *Attorney, Agent, or Firm*—Oblon, Spivak, McClelland, Maier & Neustadt, P.C.

(57) ABSTRACT

An n-InP cladding layer, a GRIN-SCH-MQW active layer, a p-InP cladding layer, p-InGaAsP contact layer and a p-side electrode are laminated sequentially on an n-InP substrate. Moreover, a film having high reflectivity is laminated on a reflection side end surface, and a transmission film is laminated on an emission side end surface. The transmission film has a first film and a second film. The second film is composed of an equivalent film composed of three layers.

45 Claims, 13 Drawing Sheets

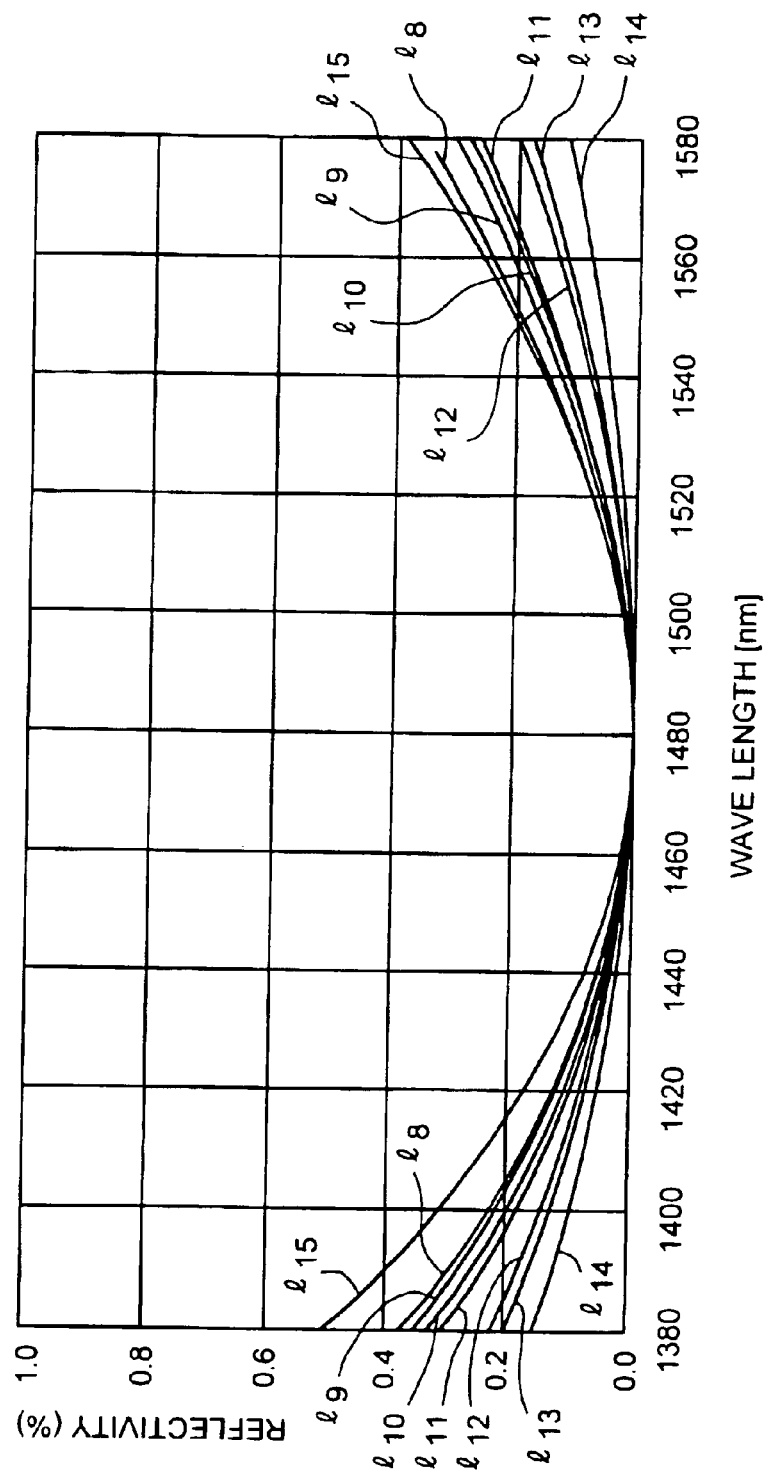

SEMICONDUCTOR LASER DEVICE AND SEMICONDUCTOR LASER MODULE USING THE DEVICE AND METHOD FOR LOW REFLECTIVITY

BACKGROUND OF THE INVENTION

1) Field of the Invention

The present invention relates to a semiconductor laser device and a semiconductor laser module using the device.

2) Description of the Related Art

Conventionally, a semiconductor laser device as a light wave oscillator which utilizes photon induced emission due to an optical transition of electrons in a semiconductor crystal is widely known. Such a semiconductor laser device generally includes a resonator and oscillates a laser through light amplification by the resonator.

As the most basic structure of the resonator, the structure which adopts a Fabry-Perot resonator composed of two parallel reflection surfaces is known. Since the Fabry-Perot resonator can be easily formed by cleaving the semiconductor crystal composing the semiconductor laser device or polishing the semiconductor crystal into a mirror finished surface, it is widely used when using a semiconductor laser device as an ordinary light source.

However, in an optical communication system to be utilized for data communication represented by Internet or the like, the semiconductor laser device having the Fabry-Perot resonator is insufficient. In the optical communication, it is necessary to increase the intensity of a peak of a laser beam emitted from a semiconductor laser device to be used as a signal light source or an excitation light source in an emission wavelength and to reduce a half-width of the peak. Particularly in a dense-wavelength division multiplexing (DWDM) communication method which has been developed in recent years, it is necessary to use a laser beam having a plurality of wavelengths in a narrow wavelength range, and a half-width of peaks of the respective laser beams should be very narrow. It is extremely difficult to emit such a laser beam having a narrow half-value of a peak from the semiconductor laser device using the Fabry-Perot resonator.

For this reason, there suggests a semiconductor laser module which is provided additionally with a fiber grating in an optical fiber. FIG. 13 shows a structure of such a semiconductor laser module. This semiconductor laser module is composed of a structure such that a semiconductor laser device 101 is optically coupled with an optical fiber 104 via a first lens 102 and a second lens 103. In order to carry out laser oscillation, the resonator is composed of a reflection side end surface 106 and a fiber grating 105 arranged in the optical fiber 104. Since the fiber grating 105 has a sharp wavelength selection characteristic, the structure shown in FIG. 13 makes a peak of an oscillation laser beam sharp theoretically, and thus the peak intensity increases.

Alternatively, there also suggest a semiconductor laser device in which a diffraction grating is arranged in a vicinity of an active layer so as to generate a DFB (distributed feed back) laser and a DBR (distributed bragg reflector) laser which carry out single mode oscillation, and a semiconductor laser device in which a diffraction grating is arranged so as to generate a plurality of longitudinal oscillation modes mainly having a constant wavelength. Such semiconductor laser devices do not use a Fabry-Perrot resonator but uses a resonator having an additional excellent wavelength selection characteristic so as to obtain a sharp peak. This point is common to the semiconductor laser module using a fiber grating.

However, it is known that the semiconductor laser devices which include the resonator having the sharp wavelength selection characteristic have a problem. The above-explained semiconductor laser devices and laser module (hereinafter, referred to as "semiconductor laser device and the like") normally have an emission side end surface 107 in a laser emitting direction as shown in FIG. 13. The emission side end surface 107 and the reflection side end surface 106 form the Fabry-Perot resonator. Therefore, an actual semiconductor laser device and the like have a structure such that an additionally provided resonator having a sharp wavelength selection characteristic and the conventional Fabry-Perot resonator coexist. In order to suppress amplification by the Fabry-Perot resonator, a single-layer film made of alumina ($Al_2O_3$) or the like is laminated on the emission side end surface 107 so that a reflectivity of a laser beam is reduced on the emission side end surface 107. However, actually a reflectivity of about 1 to 5% remains and an influence of the Fabry-Perot resonator cannot be eliminated completely.

On the contrary, a multi-layer film (hereinafter, referred to as "equivalent single-layer film") which is optically equivalent to the single-layer film is laminated on the emission side end surface so that a reflectivity of a laser beam is made to be zero on the emission side end surface. This technique is disclosed in Japanese Patent Application Laid-Open No. 5-243689 (1993) (hereinafter, referred to as "conventional art"). The reflectivity on the emission side end surface becomes zero when the following equation is established, $$n_f = (n_s n_o)^{1/2} \qquad (1)$$

wherein $n_f$ is refractive index of the single-layer film, $n_s$ is an effective refractive index of a semiconductor crystal composing the semiconductor laser device, and $n_o$ is a refractive index of an external air contacting with the emission side end surface. When $n_o$ is equal with one since it is a refractive index of air, the refractive index of the single-layer film is a square root of the effective refractive index of the semiconductor crystal. For example, when the semiconductor crystal composing the semiconductor laser device is made of InP, since $n_s$ equals to 3.25 when an emission wavelength λ is 1480 nm, $n_f$ nearly equals to 1.8. Since a material which satisfies the equation $n_f$ nearly equals to 1.8 has a problem in a strength and the like when the single-layer film is used as an actual transmission film, a plurality of films having predetermined refractive index and thickness are laminated so that an equivalent film of which entire refractive index becomes 1.8 is formed.

However, the conventional art has a problem. A wavelength of a laser beam oscillated from the semiconductor laser device occasionally deviates from a design value. When it is so, even when the equivalent single-layer film is formed according to a calculated value disclosed in the conventional art, the reflectivity zero cannot be realized, and thus there is a problem that the reflectivity becomes large. Since the refractive index is a function with respect to a wavelength of a transmitting light, the wavelength of the laser beam deviates so that the refractive index of plural materials forming the film also changes. Therefore, the entire refractive index also changes naturally, and the refractive index of the equivalent single-layer film obtains a value different from the refractive index realizing entire reflection. When the reflectivity due to this problem can be suppressed to an allowably low value, there arises no problem.

However, the equivalent single-layer film of the conventional art has a problem that a light of specified wavelength is not reflected but a light of a wavelength other than the specified wavelength is reflected greatly and thus the film functions as a cut filter as signified by the inventors. In general, when scattering of a laser beam emitted from the semiconductor laser device and scattering of film forming are taken into consideration, it is necessary to allow an error of about ±100 nm with respect to the design value. Therefore, the above conventional art has a problem in view of this point, and since the reflectivity of the emission side end surface with respect to a light having deviated wavelength becomes high, the Fabry-Perot resonator is formed.

In addition, the equivalent single-layer film of the conventional art has a problem of controlling thicknesses of the plural films to be laminated. In the conventional art, the equivalent single-layer film is composed of a multi-layer film made of the respective films having 90.23 nm or 8.25 nm thickness, but when the film is grown by electron beam vacuum evaporation, sputtering or the like, it is necessary to take the possibility of lamination error of about ±5% into consideration. Therefore, the actually laminated equivalent single-layer film does not occasionally have the reflectivity of zero due to the error of the lamination thickness. For this reason, in order to suppress the forming of the Fabry-Perot resonator effectively, it is necessary to previously design a structure such that even when the error of the lamination occurs, the reflectivity can be suppressed to a very low value.

In view of these problems, the film to be laminated on the emission side end surface of the semiconductor laser device should have a reflectivity of zero or an extremely low reflectivity with respect to a wavelength which is deviated by a certain amount from the specified wavelength, and even when the lamination error occurs in the film growth, a fluctuation of the reflectivity should be small. However, a study in view of this has not been particularly made until now.

SUMMARY OF THE INVENTION

It is an object of the present invention to provide a semiconductor laser device and a semiconductor laser module in which even when an oscillation wavelength and a thickness of films to be laminated on an emission side end surface deviate, a reflectivity on the emission side end surface becomes zero or obtains an extremely low value and to provide method for providing a semiconductor laser device having the extremely low reflectivity According to one aspect of the present invention, there is provided a semiconductor laser device and method for having a reflection side end surface which reflects a laser beam to be oscillated and an emission side end surface which emits the laser beam, comprising a transmission film which includes a multi-layer film laminated on the emission side end surface and having a low reflectivity with respect to the laser beam to be emitted and having a structure of plural films, wherein at least one-layer film of the multi-layer film is an equivalent film which is optically equivalent to the one-layer film and includes a plurality of films.

According to the above aspect, the multi-layer film structure reduces the reflectivity with respect to the wavelength deviating from the laser beam by a constant range and can suppress an influence of a Fabry-Perot resonator as compared with when non-reflectivity is realized by a single-layer film.

According to another aspect of the present invention, there is provided a semiconductor laser module comprising, an above-mentioned semiconductor device, a temperature control module which controls a temperature of the semiconductor laser device, an optical fiber which guides the laser beam emitted from the semiconductor laser device to the outside, and an optically coupling lens system which optically couples the semiconductor laser device with the optical fiber.

According to the above aspect, the above-mentioned semiconductor laser device is used, so that a laser beam, of which peak intensity in the emission wavelength is large and half-width of the peak is narrow, can be emitted.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 6 is a graph which shows a change of the reflectivity with respect to different refractive index.

DETAILED DESCRIPTIONS

Figure 1:
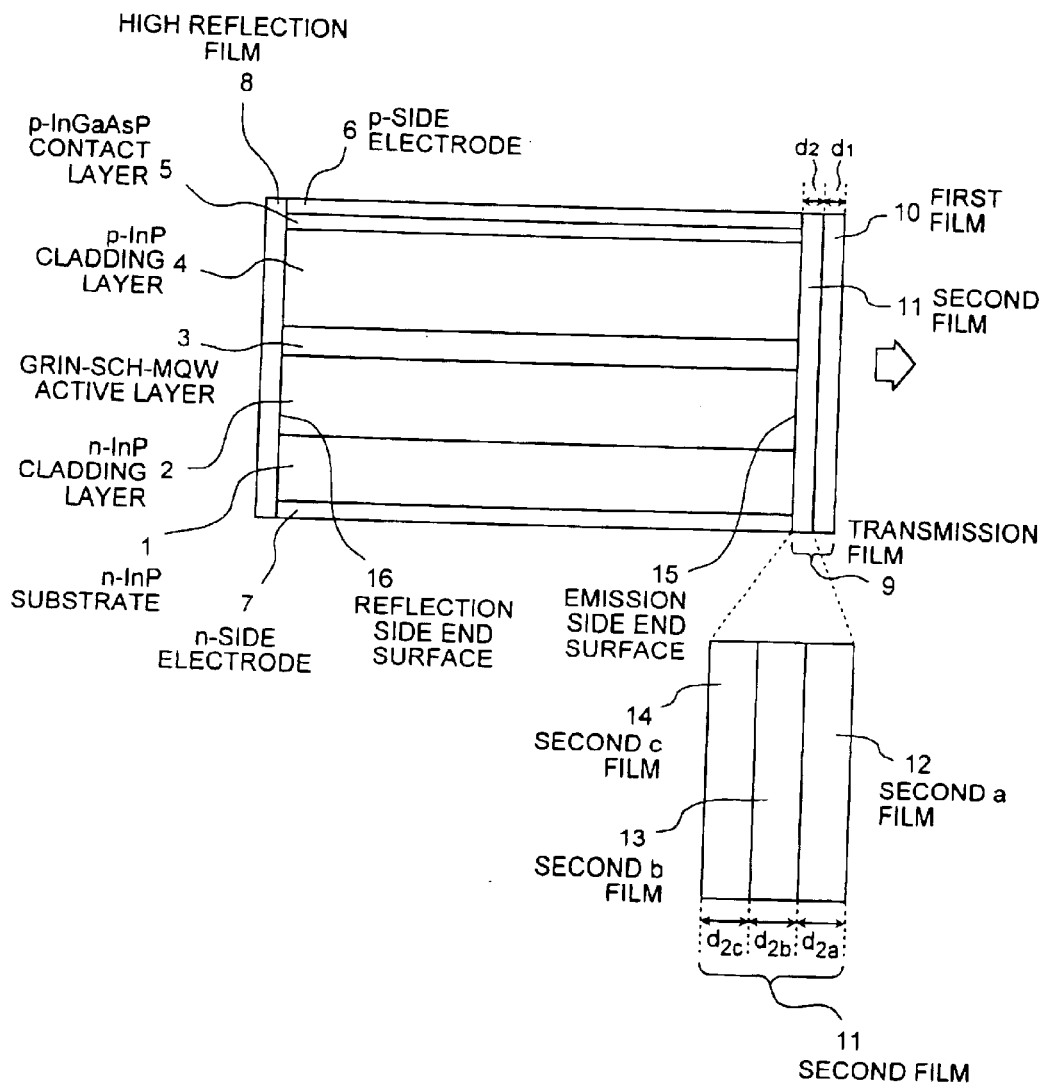
FIG. 1 is a side sectional view which shows a structure of a semiconductor laser device according to a first embodiment.

Preferred embodiments of a semiconductor laser device and a semiconductor laser module of the present invention will be explained below with reference to the accompanying drawings. In the drawings, the same or similar reference numerals are given to the same or similar components. It is necessary to note that the drawings show typical examples, and a relationship between a thickness and a width of a layer, and a percentage of the thickness of the respective layers are different from actual ones. Moreover, needless to say, the respective drawings include parts that dimensional relationships and percentages are different.

First Embodiment

First, a semiconductor laser device according to a first embodiment of the, present invention will be explained. FIG. 1 is a side sectional view which shows a structure of the semiconductor laser device according to the first embodiment. The semiconductor laser device of the first embodiment is constituted so that an n-InP cladding layer 2, a GRIN-SCH-MQW active layer 3, a p-InP cladding layer 4, a p-InGaAsP contact layer 5 and a p-side electrode 6 are laminated sequentially on an n-InP substrate 1. Moreover, an n-side electrode 7 is arranged below the n-InP substrate 1. Further, the semiconductor laser device of the first embodiment is constituted so that a high reflectivity film 8 is laminated on a reflection side end surface 16 (left end surface in FIG. 1) and a transmission film 9 including a first film 10 and a second film 11 is laminated on an emission side end surface 15 (right end surface in FIG. 1). Further, the second film 11 is composed of an equivalent film composed of three layers including a first sub-film 12, a second sub-film 13, and a third sub-film 14. Hereinafter, the film having such a structure is referred to as an equivalent two-layer film.

The n-InP cladding layer 2 and the p-InP cladding layer 4 are composed of substances having a larger band gap than the GRIN-SCH-MQW active layer 3. This is because a carrier contributing to laser oscillation is sealed in the GRIN-SCH-MQW active layer 3. Moreover, the p-InGaAsP contact layer 5 is provided so as to obtain ohmic contact with the p-side electrode 6, and p-type impurity is doped in a high-density manner. A wavelength of a laser beam emitted from the semiconductor laser device in the first embodiment is 1480 nm.

The semiconductor laser device of the first embodiment has the transmission film 9 including the first film 10 and the second film 11 on the emission side end surface 15 as explained above. Further, the second film 11 has the equivalent two-layer film structure composed of the first sub-film 12, the second sub-film 13, and the third sub-film 14. The transmission film 9 will be explained below.

Figure 13:
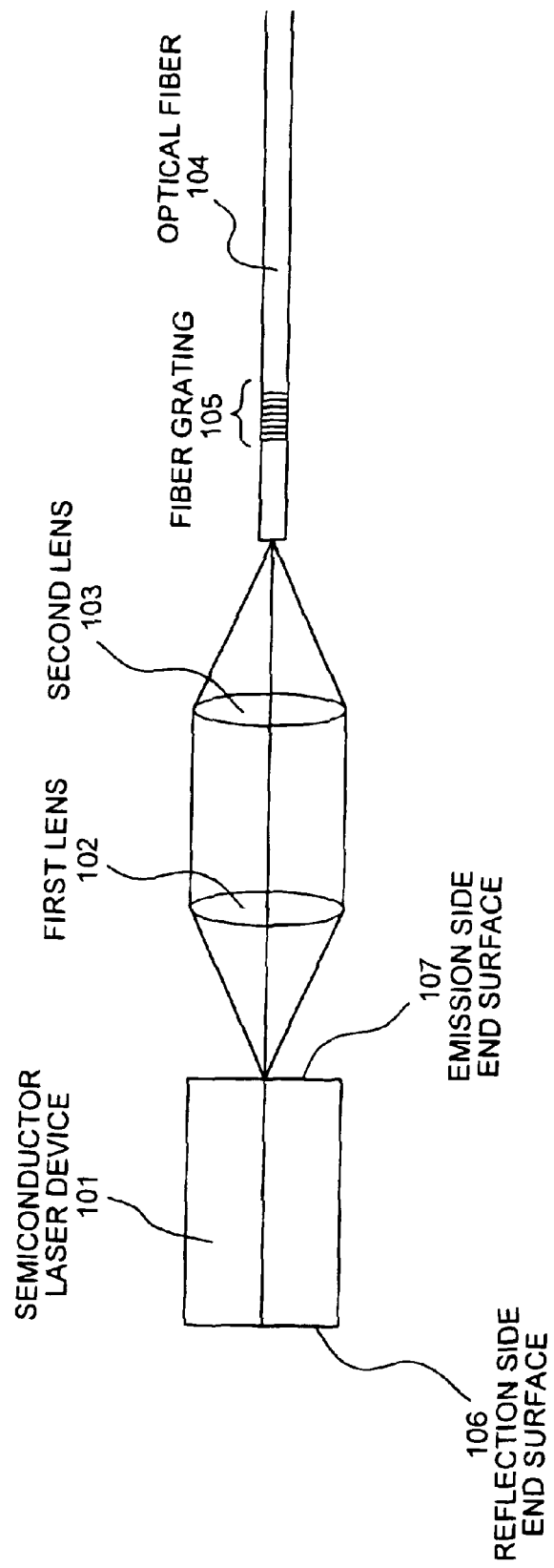
FIG. 13 is a schematic diagram which shows a mechanism of a semiconductor laser module of the conventional art.

In the semiconductor laser device of the first embodiment, a resonator is not constituted by the emission side end surface 15 and the reflection side end surface 16 unlike a semiconductor laser device using the conventional Fabry-Perot resonator. In the semiconductor laser device of the first embodiment, the resonator is composed of the high reflectivity film 8 laminated on the reflection side end surface 16 and an external diffraction grating such as a fiber grating exemplified in FIG. 13. Therefore, the high reflectivity film 8 is composed of a substance which realizes a reflectivity of a certain degree, whereas the transmission film 9 laminated on the emission side end surface 15 should have a reflectivity which is low as in order to prevent the Fabry-Perot resonator from being formed, and more preferably it is necessary to set the reflectivity of an oscillation laser beam on the emission side end surface 15 to 0. The reflectivity is a ratio between input optical strength and reflecting optical strength when light having specific wavelength is input from outside to the emission side end surface 15. The reflectivity of the emission side end surface 15 can be determined by measuring the strength of the input and reflected light. However, since the semiconductor laser devices are very small, generally the reflectivity is calculated by examining the composition of the semiconductor laser device. Precisely, a Scanning Electron Microscope (SEM) is used to measure the thickness of a thin film structure, which has a plurality of thin films, that is laminated on the emission side end surface 15. Moreover, an Auger Electron Spectroscope (AES) is used to calculate the composition of each thin film in the thin film structure. The reflectivity of the emission side end surface 15 is precisely calculated using the calculated composition in a spectroscopic ellipsometry. The reflectivity mentioned below is either calculated using the method described above or really measured.

In addition, in the actual semiconductor laser device, the wavelength of the laser beam to be emitted fluctuates due to a level of an electric current to be injected into the GRIN-SCH-MQW active layer 3 or a temperature of the GRIN-SCH-MQW active layer 3. Moreover, the emission wavelength of a produced semiconductor laser device occasionally obtains a value different from a value at the stage of the design. Therefore, it is necessary to constitute the transmission film 9 so that it allows a light to transmit not only in a specified wavelength but the reflectivity of a light deviating by a constant wavelength range from a the specified wavelength on the emission side end surface 15 becomes low or zero. Specifically, it is necessary to constitute the transmission film 9 so that the Fabry-Perot resonator is not formed for a light which deviates by about ±100 nm with respect to the specified wavelength.

Further, it is necessary to heighten tolerance of an error in the actual formation of the film. In the actual film growth, since there occurs an error on the film thickness of about +5%, it is necessary that even when the error occurs, the reflectivity on the emission side end surface 15 obtains a low value which can be allowed.

Based on these points, it is necessary to design the structure of the first film 10 and the second film 11 composing the transmission film 9, and the structure of the first sub-film 12, the second sub-film 13, and the third sub-film 14 composing the second film 11. In the following explanation, a refractive index of the first film 10 is $n_1$ and its thickness is $d_1$, and the second film 11 has a refractive index $n_2$ and a thickness $d_2$. Similarly, the first sub-film 12 has a refractive index $n_{2a}$ and a thickness $d_{2a}$, the second sub-film 13 has a refractive index $n_{2b}$ and a thickness $d_{2b}$, and the third sub-film 14 has a refractive index $n_{2c}$ and a thickness $d_{2c}$. In the following explanation, these refractive indexes are values with respect to a wavelength of a laser beam emitted from the semiconductor laser device of the first embodiment.

First, a relationship between $n_1$, $d_1$, $n_2$, $d_2$ and a reflectivity of an oscillation laser beam on the emission side end surface 15 will be explained. An oscillation wavelength of the laser beam is $\lambda$, and a refractive index of the GRIN-SCH-MQW active layer 3 is $n_s$. Moreover, a refractive index $n_0$ of an external air contacting with the first film 10 is $n_0$. The following equations realize the reflectivity zero with respect to the specified wavelength $\lambda$ in a general two-layer film.

$$\tan^2\delta_1 = n_1^2(n_s-n_0)(n_2^2-n_0 n_s)/\{(n_1^2 n_s - n_2^2 n_0)(n_0 n_s - n_1^2)\} \quad (2)$$

$$\tan^2\delta_2 = n_2^2(n_s-n_0)(n_0 n_s - n_1^2)/\{(n_1^2 n_s - n_2^2 n_0)(n_2^2 - n_0 n_s)\} \quad (3)$$

$\delta j = 2\pi n_j d_j/\lambda$ (j=1, 2). In the equations (2) and (3), $n_0$ is the refractive index of external air (with air, 1.0), and $n_s$ is a constant which is determined by a material of the semiconductor laser device. Therefore, the equations (2) and (3) are equations in which $n_1$, $d_1$, $n_2$ and $d_2$ are variables, and two variables of the four variables are determined, so that the structures of the first film 10 and the second film 11 can be determined from the equations (2) and (3).

In general, the refractive index $n_s$ of the GRIN-SCH-MQW active layer 3 obtains a value of 3 to 4, and accordingly the refractive indexes $n_1$ and $n_2$ of the first film 10 and the second film 11 can be obtained from the equations (2) and (3) as the following table.

TABLE 1

| Refractive index $n_s$ of active layer | Refractive index $n_1$ of the first film | Refractive index $n_2$ of the second film |
|---|---|---|
| 3 | 1.1 | 1.8~1.9 |
|   | ~ | |
|   | 1.7 | 1.8~2.9 |
| 3.25 | 1.1 | 1.9 |
|   | ~ | |
|   | 1.8 | 1.9~3.2 |
| 3.5 | 1.1 | 1.9~2.0 |
|   | ~ | |
|   | 1.8 | 1.9~3.3 |
| 3.75 | 1.1 | 2.0~2.1 |
|   | ~ | |
|   | 1.9 | 2.0~3.6 |
| 4 | 1.1 | 2.1 |
|   | ~ | |
|   | 1.9 | 2.1~3.7 |

Therefore, when the refractive indexes $n_s$ and $n_1$ are determined, the refractive index $n_2$ of the second film 11 is also determined, and the film structures of the first sub-film 12, the second sub-film 13, and the third sub-film 14 can be determined so that the refractive indexes having such values are realized.

Next, a method of determining the structures of the first sub-film 12, the second sub-film 13, and the third sub-film 14 composing the second film 11 will be explained. In general, a film having constant refractive index and thickness can be expressed by a characteristic matrix M which is a two-dimensional square matrix. When an element of the characteristic matrix $M_k$ is $m_{ij}$ ($1 \leq i, j \leq 2$), generally a film having refractive index $n_k$ and thickness $d_k$ can be expressed by the following equations, $$m_{11} = m_{22} = \cos\phi_k \quad (4)$$

$$m_{12} = i n_k^{-1} \sin\phi_k \quad (5)$$

$$m_{21} = i n_k \sin\phi_k \quad (6)$$

where $\phi$ is equal to $2\pi n_k d_k/\lambda$, and i is an imaginary unit. The first sub-film 12, the second sub-film 13, and the third sub-film 14 also can be defined in the similar manner, and thus a characteristic matrix of the second film 11 is $M_2$, a characteristic matrix of the first sub-film 12 is $M_{2a}$, a characteristic matrix of the second sub-film 13 is $M_{2b}$ and a characteristic matrix of the third sub-film 14 is $M_{2c}$. A relationship between $M_2$, $M_{2a}$, $M_{2b}$ and $M_{2c}$ is represented by the following equation, $$M_2 = M_{2a} * M_{2b} * M_{2c} \quad (7)$$

Since the equation (7) is a relational expression of the two-dimensional square matrix, equations are established for the respective elements of the matrix, and actually four equations are established. When the refractive index $n_1$ of the first film 10 and the refractive index $n_2$ of the second film 11 are determined in the equations (2) and (3), four equations exist for six variables $n_{2a}$, $d_{2a}$, $n_{2b}$, $d_{2b}$, $n_{2c}$ and $d_{2c}$. Therefore, when arbitrary two of these variables are determined, the rest variables are also obtained by the equation (7). Accordingly, the structures of the first sub-film 12, the second sub-film 13, and the third sub-film 14 are determined.

In the first embodiment, the first sub-film 12 and the third sub-film 14 are formed by the same material and are designed so as to have the equal film thickness. This is because a multi-layer film having a symmetrical structure with respect to a center surface is equivalent to a single-layer film according to A. Thelen, "Physics of Thin Films", Vol. 5, Academic Press, New York (1969). Moreover, this is because the same material is used, so that the producing steps can be simplified. Therefore, in the first embodiment, $n_{2a}$ is equal to $n_{2c}$ and $d_{2a}$ is equal to $d_{2c}$, and the variables in the equation (7) are reduced to four so that all the values of the variables can be obtained.

According to the above explanation, the refractive index $n_1$ of the first film 10 and the refractive index $n_2$ of the second film 11 are determined and the equations (2) to (7) are calculated, so that the structures of the first sub-film 12, the second sub-film 13, and the third sub-film 14, composing the second film 11, and the structure of the first film 10 can be determined. Therefore, the structure of the transmission film 9 composed of the first film 10 and the second film 11 is determined.

Next, a method of determining the refractive index $n_1$ of the first film 10 and the refractive index $n_2$ of the second film 11 will be explained. First, a substance composing the first film 10 is determined. The first film 10 is not an equivalent film as shown in FIG. 1 and is composed of one kind of a material, and thus a composing material is determined so that the refractive index $n_1$ is determined.

A specific material composing the first film 10 is $Al_2O_3$ in the first embodiment. $Al_2O_3$ has been conventionally known as a material of a low reflectivity film, and its characteristic and film growth have been studied in various manners. Therefore, it is confirmed that $Al_2O_3$ easily grows on an end surface of the semiconductor laser device and it is stable during the long-time use of the semiconductor laser device. When the first film 10 is composed of $Al_2O_3$, the refractive index $n_1$ becomes 1.620 with respect to a light having a wavelength $\lambda$ of 1480 nm.

In addition, a composing material of the second film 11 is also previously determined. Since the first sub-film 12, and the third sub-film 14 have the same refractive index as explained above, they are composed of the same material. In the first embodiment, the first sub-film 12, and the third sub-film 14 are made of $Al_2O_3$, and the second sub-film 13 is made of amorphous silicon (hereinafter, referred to as "α-Si"). $Al_2O_3$ is used because it grows easily and is stable during the long-time use and also as the first sub-film 12 and the first film 10 are adjacent to each other, thus the same material is used for these two films so that the first sub-film 12 and the first film 10 can be grown sequentially. Moreover, α-Si is used for the second sub-film 13 because, similarly to $Al_2O_3$, it is a known material and makes film growth easy on the end surface and is stable during the long-time use.

As understood from the equation (7), the refractive index $n_2$ of the second film 11 cannot be determined only by determining the composing materials of the first sub-film 12, the second sub-film 13 and the third sub-film 14. Whereas in the first embodiment, since the refractive index $n_1$ has been already determined, when the refractive index $n_2$ is determined, all parameters composing the transmission film 9 are determined by the equations (2) to (7).

According to the above explanation, the refractive index $n_1$ is already determined. Therefore, in order to obtain the transmission film 9 which have a large tolerance of the lamination error and can realize a very low reflectivity in a wavelength which deviates from the specified wavelength, the refractive index $n_2$ is set to various values, and characteristic of the transmission film 9 are studied, and a range of the refractive index $n_2$ is determined, so that the structure of the transmission film 9 is determined.

Figure 2:
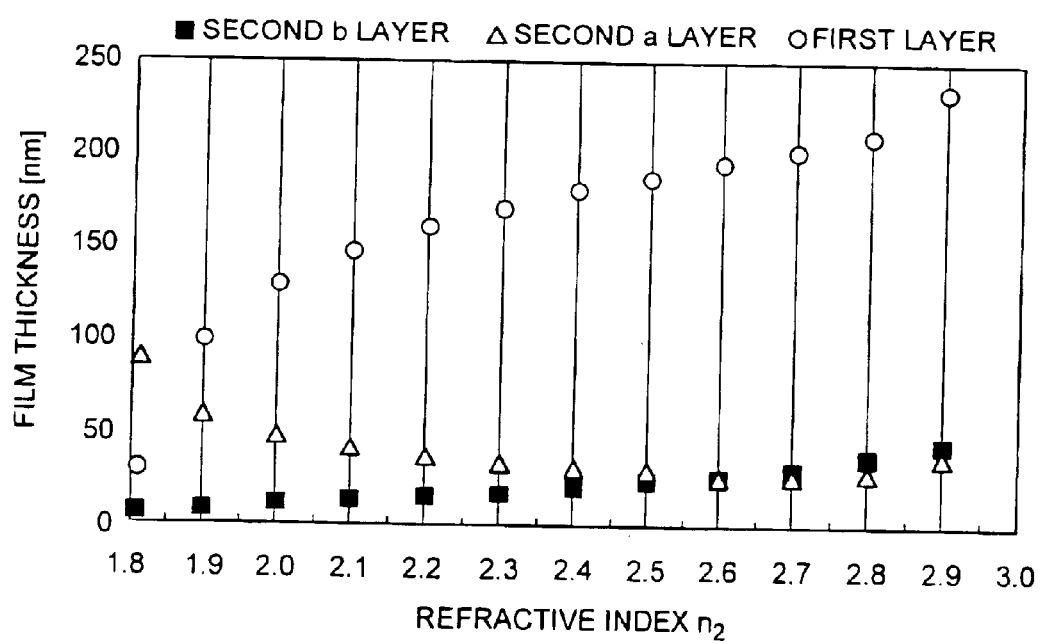
FIG. 2 is a graph which shows a film thickness of respective layers with respect to a change of a refractive index of a second film in a transmission film composing the semiconductor laser device of the first embodiment.

FIG. 2 is a graph which shows the film thickness $d_1$, $d_{2a}$ and $d_{2b}$ of the respective layers with respect to a fluctuation of the refractive index $n_2$. Since the thickness $d_{2c}$ of the third sub-film 14 has the same value as the thickness $d_{2a}$, it is not shown on the graph. The range of the refractive index $n_2$ is 1.8 to 3.0 in FIG. 2 because when the refractive index is 1.8, this is the same as a refractive index when the single-layer film of the conventional art is represented by a transmission film, and thus the first layer 10 is not necessary and an advantage of the multi-layer film is eliminated. Moreover, the reason that the upper limit is 3 is as follows. The main material of the semiconductor laser device of the first embodiment is InP, and the refractive index $n_s$ is 3.25. Therefore, when the refractive index $n_2$ exceeds 3, a difference with the refractive index of the semiconductor laser device is substantially eliminated, and thus the provision of the second film 11 becomes meaningless.

According to FIG. 2, as the refractive index $n_2$ becomes larger, the film thickness of the first film 10 and the second sub-film 13 increase, and the film thickness of the first sub-film 12 becomes minimum in a vicinity of the refractive index $n_2$ is equal to 2.5. These values are obtained by calculating the equations (2) to (7) where $n_2$ is a variable.

Figure 3A:
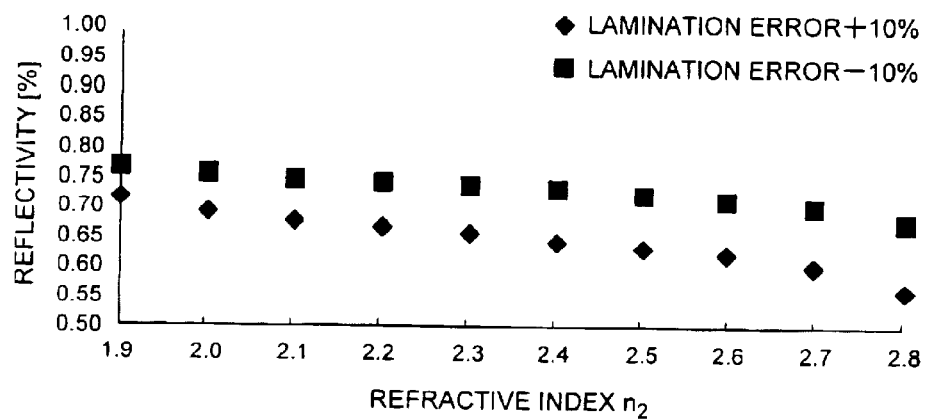
FIG. 3A is a graph which shows a change of a reflectivity of the transmission film with respect to a lamination error of alumina included in the first film and the second film.
Figure 3B:
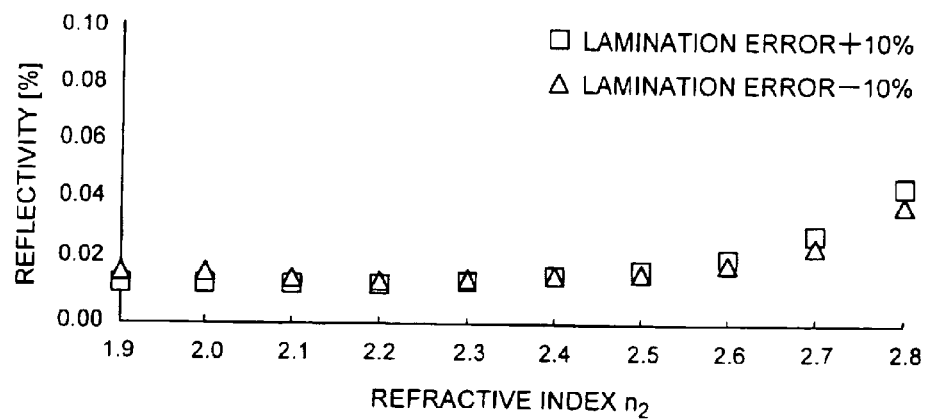
FIG. 3B is a graph which shows a change of the reflectivity of the transmission film with respect to a lamination error of amorphous silicon included in the second film.

FIGS. 3A and 3B are graphs which show a tendency of a change of the reflectivity on the emission side end surface 15 with respect to the lamination error in the structure of the transmission film 9 determined in FIG. 2. FIG. 3A shows as to how much a laser beam is reflected on the emission side end surface 15 when the thickness of the first film 10, the first sub-film 12, and the third sub-film 14 made of $Al_2O_3$ deviate from the design values by ±10%. Moreover, FIG. 3B shows a reflectivity on the emission side end surface 15 when the film thickness of α-Si composing the second sub-film 13 deviates from the design value by ±10%. In the actual film growth, an error can be normally suppressed to ±5% or less, but in FIGS. 3A and 3B, in order to clearly show the tendency of the change of the reflectivity with respect to the lamination error, the lamination error is assumed to be large.

As shown in FIG. 3A, as for $Al_2O_3$, when the refractive index $n_2$ of the second film 11 is previously designed to be larger, the reflectivity can be suppressed low even when the lamination error occurs. Particularly, the reflectivity can be suppressed remarkably when the lamination error is +10%. On the contrary, as for the lamination error of α-Si, as shown in FIG. 3B, when the refractive index $n_2$ is designed to be large, the reflectivity on the emission side end surface 15 becomes large.

Therefore, FIGS. 3A and 3B show opposite results respectively, but since the reflectivity due to the lamination error of the α-Si is maximally 0.05%, that is very low, an actual problem does not arise. For this reason, in order to suppress the reflectivity with respect to the lamination error of $Al_2O_3$, the refractive index $n_2$ of the second film 11 is desirably about 2.4 to 3.0. With such a limitation, when the lamination error in the actual film growth is within ±5%, the reflectivity due to the lamination error can be suppressed to about 0.35% maximally. In the first embodiment, as a specific example to study a characteristic in this range, the structure where $n_2$ is equal to 2.5 and the structure where $n_2$ is equal to 2.92 are selected. When $n_2$ is equal to 2.5, according to the equations (2) to (7), $d_1$ is equal to 187.3 nm, $d_{2a}$ and $d_{2c}$ are equal to 29.7 nm, and $d_{2b}$ is equal to 23.9 nm. Moreover, when $n_2$ is equal to 2.92, similarly according to the equations (2) to (7), $d_1$ is equal to 216.0 nm, $d_{2a}$ and $d_{2c}$ are equal to 50.2 nm and $d_{2b}$ is equal to 46.8 nm.

Figure 4A:
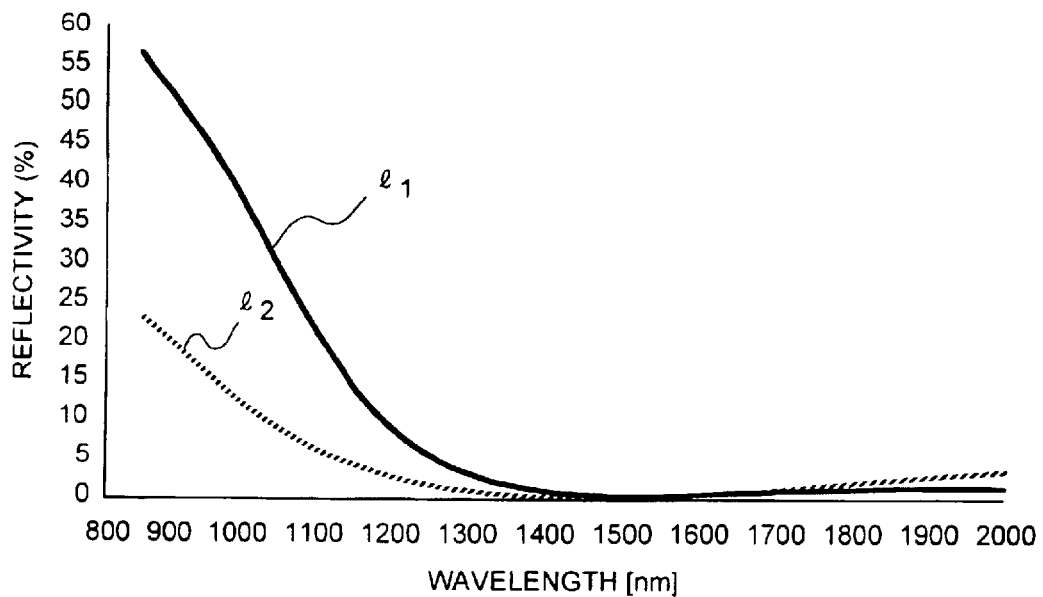
FIG. 4A is a graph which shows a change of the reflectivity with respect to a wavelength in the transmission film when a refractive index of a second layer is 2.92.

FIG. 4A shows a change of the reflectivity with respect to the emission wavelength λ in the transmission film where $n_2$ is equal to 2.92. In FIG. 4A, a curved line $I_1$ shows a change of the reflectivity of the transmission film 9 having the equivalent two-layer film structure in the first embodiment, and a curved line $I_2$ shows a change of the reflectivity when the second film 11 is composed of a single film. It is not realistic that the second film 11 is composed of a single film in view of selection of a material, and the curved line $I_2$ is only a logical value which is shown for comparison with the curved line $I_1$.

As for the curved line $I_1$ relating to the transmission film 9 of the first embodiment, the reflectivity becomes remarkably large in a wavelength area where the wavelength λ is 1300 nm or less as compared with the curved line $I_2$ relating to the single film. However, in the first embodiment, the reflectivity may be zero or very low in the range of 1380 nm≦λ≦1580 nm, there arises no problem. When the wavelength λ is in the range of 1380 nm≦λ≦1580 nm, the curved line $I_1$ relating to the transmission film 9 substantially matches with the curved line $I_2$ relating to the single film. For this reason, when the refractive index $n_2$ of the second film 11 is 2.92, the second film 11 is composed of an equivalent film, so that the performance which is substantially equal with when using the single film can be secured.

Figure 4B:
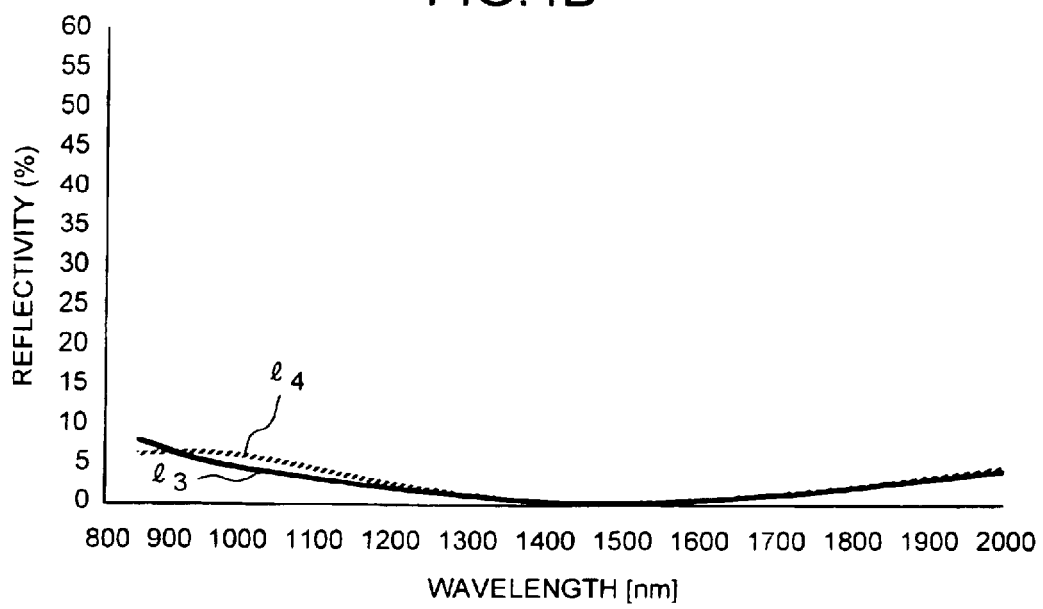
FIG. 4B is a graph which shows a change of the reflectivity with respect to a wavelength when the refractive index of the second layer is 2.5.

Similarly, FIG. 4B shows a change of the reflectivity with respect to the emission wavelength λ in the transmission film where $n_2$ is equal to 2.5. In FIG. 4B, a curved line $I_3$ shows a change of the reflectivity of the transmission film 9 in the first embodiment, and a curved line $I_4$ shows a change of the reflectivity when the second film 11 is composed of a single film.

FIG. 4B shows a graph in which when $n_2$ is equal to 2.5, the reflectivity can be suppressed lower in any wavelength ranges when the second film 11 is composed using the equivalent two-layer film in the first embodiment as compared with when the second film 11 is composed of the single film. Moreover, overlapping is seen in FIG. 4B, but even when the emission wavelength λ is in the range of 1380 nm≦λ≦1580 nm, the equivalent two-layer film of the first embodiment has an excellent characteristic as compared with the two-layer film composed of the single film.

As shown in FIGS. 4A and 4B, when compared with the two-layer film in which the second film 11 is composed of the single film, the equivalent two-layer film of the first embodiment can realize the equivalent or lower reflectivity in a wavelength range which deviates from the design wavelength.

Figure 5A:
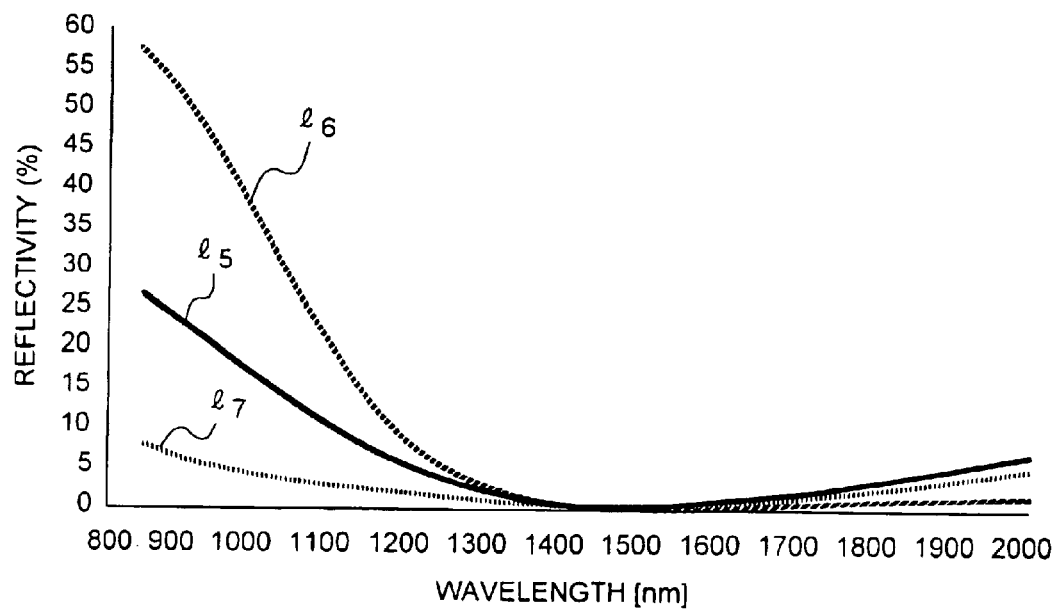
FIG. 5A is a graph which shows a change of the reflectivity of an equivalent single-layer film of a conventional art and the transmission film of the first embodiment with respect to a wavelength.

Next, the reflectivity of the conventional equivalent single-layer film structure in which the single film is replaced by a multi-layer film is compared with the reflectivity of the transmission film 9 which is the equivalent two-layer film of the first embodiment. In FIG. 5A, a curved line $I_5$ shows the reflectivity of the equivalent single-layer film of the conventional art, and a curved line $I_6$ shows the reflectivity of the equivalent two-layer film of the first embodiment in which $n_2$ is equal to 2.92. Moreover, a curved line $I_7$ shows the reflectivity of the equivalent two-layer film in which $n_2$ is equal to 2.5. As compared with the conventional art, the transmission film 9 of the first embodiment has a lower reflectivity than the conventional art in the wavelength area where the emission wavelength $\lambda$ is 1350 nm or more according to a change of the emission wavelength $\lambda$. When the emission wavelength $\lambda$ is 1350 nm or less, the reflectivity of the equivalent two-layer film in which $n_2$ is equal to 2.92 is high, but it is not particularly a problem in view of the oscillation wavelength range of the semiconductor laser device.

Figure 5B:
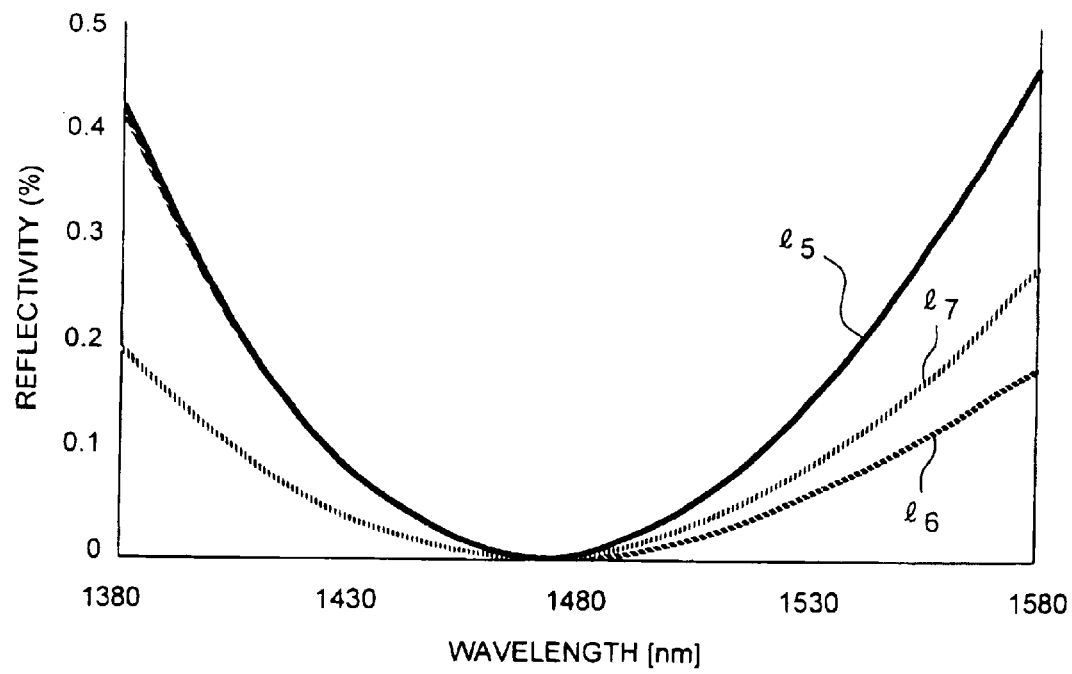
FIG. 5B is a graph which shows an enlarged predetermined wavelength range of FIG. 5A.

FIG. 5B shows the enlarged range of 1380 nm$\leq\lambda\leq$1580 nm on the graph of FIG. 5A. According to this, it is found that in the wavelength range of 1380 nm$\leq\lambda\leq$1580 nm which is an assumed emission wavelength of the semiconductor laser device of the first embodiment, the transmission film 9 of the first embodiment realizes the lower reflectivity than the conventional art. Particularly when $n_2$ is equal to 2.5, the maximum value of the reflectivity can be suppressed to about 0.25%. When $n_2$ is equal to 2.92, the reflectivity is approximately the same as that of the equivalent single-layer film of the conventional art in the range of $\lambda\leq$1480 nm, but in the range of 1480 nm$\leq\lambda$, the reflectivity can be suppressed lower.

As shown in FIG. 5B, the reflectivity of the transmission film 9 of the first embodiment can be suppressed lower than the equivalent single-layer film of the conventional art. Furthermore, when $n_2$ is equal to 2.92, it has the equivalent or excellent characteristic to the equivalent single-layer film of the conventional art, and when $n_2$ is equal to 2.5, it has more excellent characteristic. For this reason, at least when the refractive index $n_s$ of the semiconductor laser device is 3.25, the refractive index $n_2$ of the second film 11 is set within the range of 2.5 to 2.92, so that the transmission film which is more excellent than the conventional art can be provided. As it is clear from FIG. 5B, as the refractive index $n_2$ becomes smaller, the more excellent characteristic is displayed, and thus when the lamination error can be suppressed low at the time of the film growth, it is desirable that the refractive index $n_2$ is 2.5 or less.

How the reflectivity changes with change in a refractive index of the second film 11 will be explained here. FIG. 6 is a graph showing a change in reflectivity when the refractive index $n_2$ of the second layer 11 is changed from 1.9 to 2.8, in the wavelength range of 1380 nm$\leq\lambda\leq$1580 nm. Precisely, a curved line $I_8$ shows a change in the reflectivity when $n_2$ is equal to 1.9 and curved lines $I_9$, $I_{10}$, $I_{11}$, $I_{12}$, $I_{13}$, $I_{14}$ show changes in reflectivity when $n_2$ is equal to 2, 2.1, 2.3, 2.5, 2.7, 2.8 respectively. A curved line $I_{15}$ is provided for comparison. The line $I_{15}$ shows a change in reflectivity of the equivalent single-layer film explained in description of the conventional art.

It is clear from FIG. 6 that the semiconductor laser device having equivalent two-layer film structure as in the first embodiment shows lower reflectivity, for all the refractive indexes at which the reflectivity is calculated, compared to the conventional equivalent single-layer film. From this result, using equivalent multi-layer film like the equivalent two-layer film instead of equivalent single-layer film is more effective for making a film structure that lowers reflectivity for the specific wavelength range. Specifically, when the equivalent two-layer film is used, reflectivity can be suppressed below 0.4% in a wide wavelength range of 1380 nm$\leq\lambda\leq$1580 nm, which is the wavelength range where the difference between assumed emission-wavelength is below 100 nm regardless of refractive index $n_2$. More favorably, when the value of refractive index $n_2$ is equal to or greater than 2.7 (curves $I_{13}$, $I_{14}$), the reflectivity can be kept below 0.2% in a wavelength range of 1380 nm$\leq\lambda\leq$1580 nm.

Figure 8:
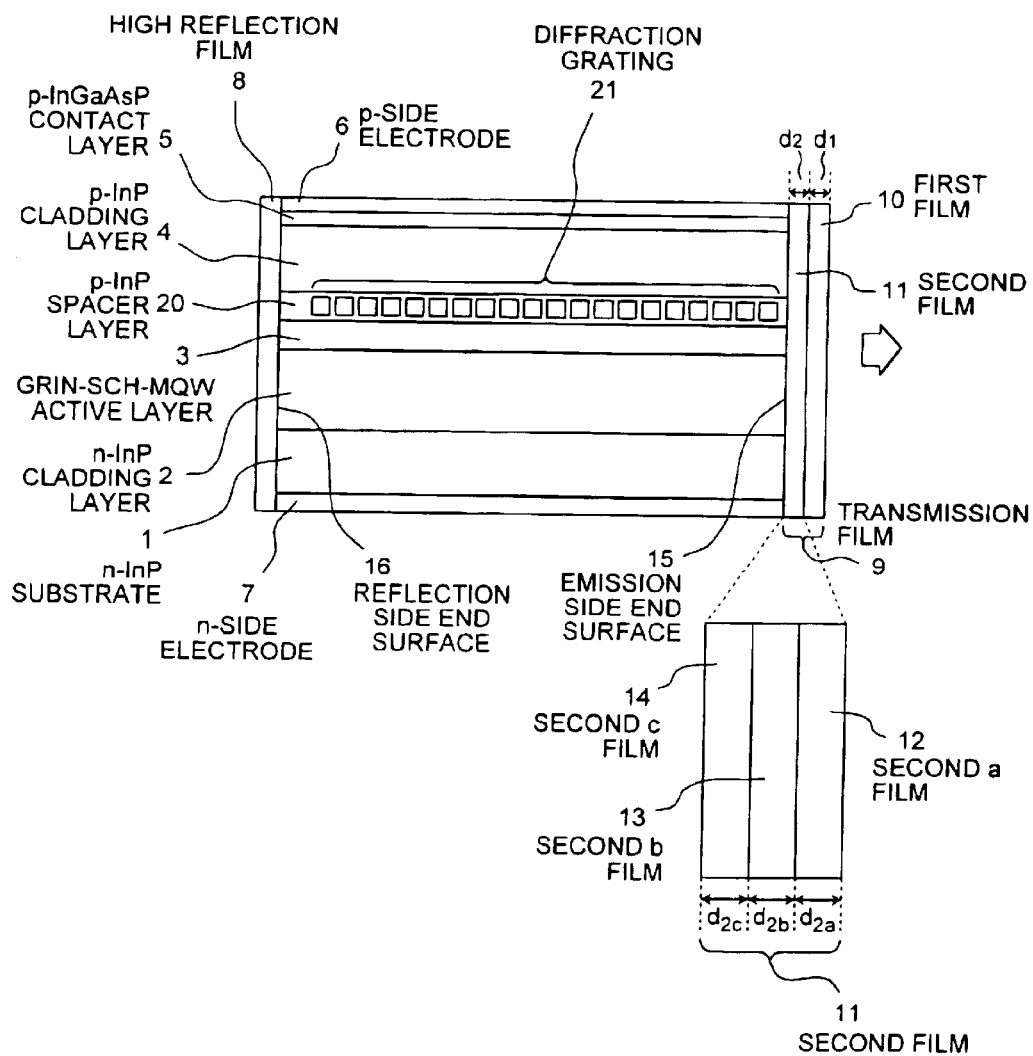
FIG. 8 is a side sectional view which shows an example of modulation in a structure of the semiconductor laser device according to the first embodiment.

The semiconductor laser device shown in FIG. 1 has the resonator which is composed of the reflection side end surface 16 and the external diffraction grating, not shown, but the resonator can have another structure. For example as shown in FIG. 8, the resonator may be DFB laser in which a p-InP spacer layer 20 is provided between the GRIN-SCH-MQW active layer 3 and the p-InP cladding layer 4, and a diffraction grating 21 is arranged inside the p-InP spacer layer 20. When it is made so, since the resonator is composed of the diffraction grating 21 and the high reflectivity film 8, it has an advantage that a diffraction grating should not be arranged on the outside. The spacer layer is arranged below the GRIN-SCH-MQW active layer 3, and the diffraction grating may be provided inside the spacer layer, and an electrically conductive type of the spacer layer then may be desirably n type.

Figure 9:
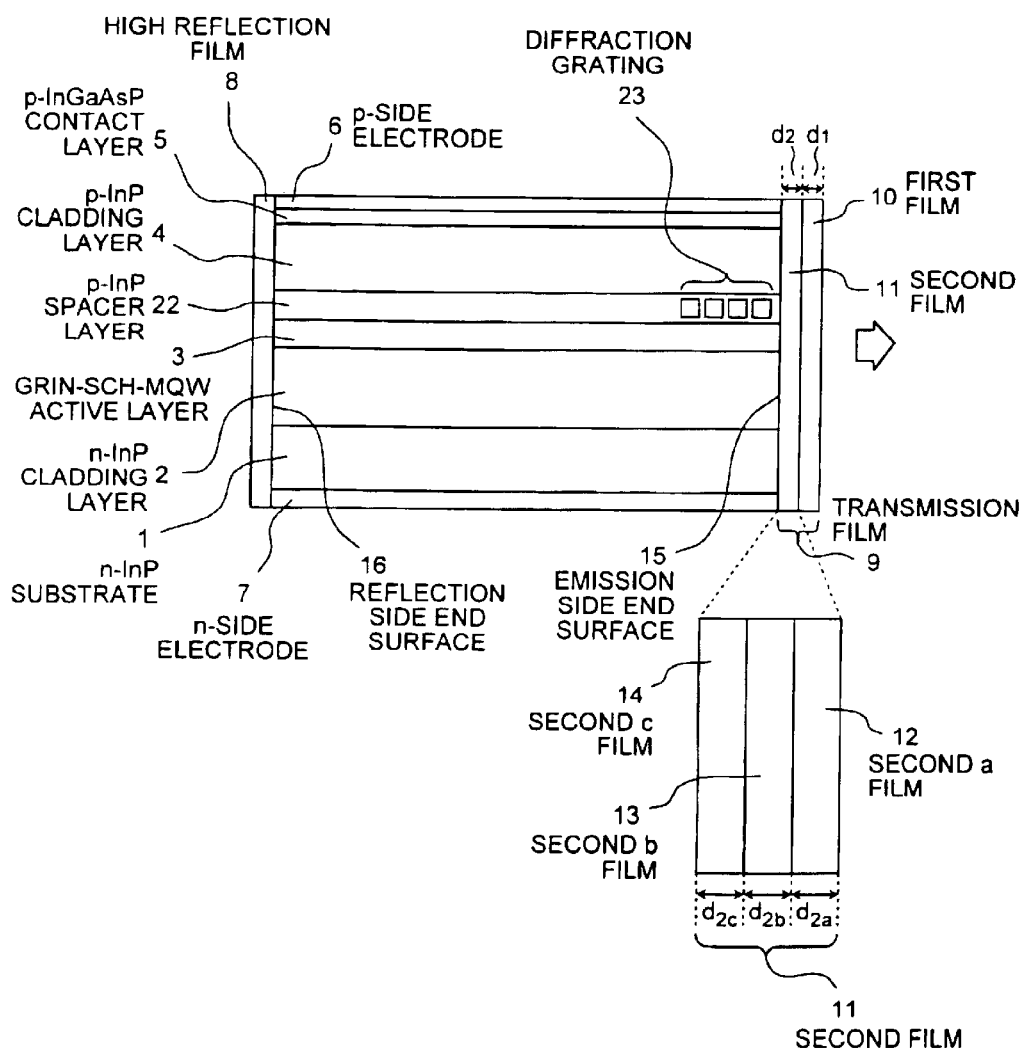
FIG. 9 is a side sectional view which shows an example of modulation in a structure of the semiconductor laser device according to the first embodiment.

In addition, as shown in FIG. 9, a p-InP spacer layer 22 is arranged between the GRIN-SCH-MQW active layer 3 and the p-InP cladding layer 4, and a diffraction grating 23 may be arranged partially inside it. A length of the semiconductor laser device in the laser beam emitting direction, a period of the diffraction grating, a value of a coupling coefficient and the like are devised, so that a laser beam having a plurality of oscillation longitudinal modes with respect to a certain constant center wavelength can be emitted. The transmission film 9 composed of the equivalent two-layer film of the first embodiment is arranged on the emission side end surface 15, so that the half-width of the peak of the respective oscillation longitudinal modes are expected to be capable of being narrowed and a wavelength distance between the oscillation longitudinal modes is expected to be capable of being narrowed.

Actually, an emission wavelength spectrum of a laser beam is measured in the semiconductor laser device having the structure shown in FIG. 9 to which the transmission film 9 of the first embodiment is applied and in a semiconductor laser device to which the conventional transmission film (reflectivity, 1.5%) is applied. The semiconductor laser devices which are constituted so that the diffraction grating is provided inside and the resonator is composed of the reflection film formed on the reflection side end surface and the diffraction grating is used. When the values of the injection electric current I are 200 mA, 500 mA and 900 mA, the emission wavelength spectrum was measured. The respective semiconductor laser devices were produced under the same condition except the transmission films.

Figure 7A:
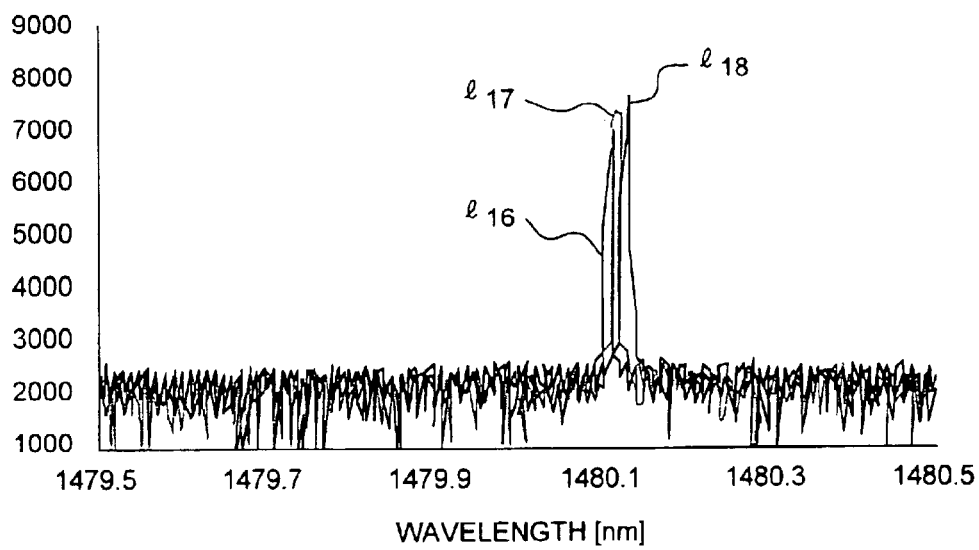
FIG. 7A is a spectrum diagram measured in the semiconductor laser device of the first embodiment.
Figure 7B:
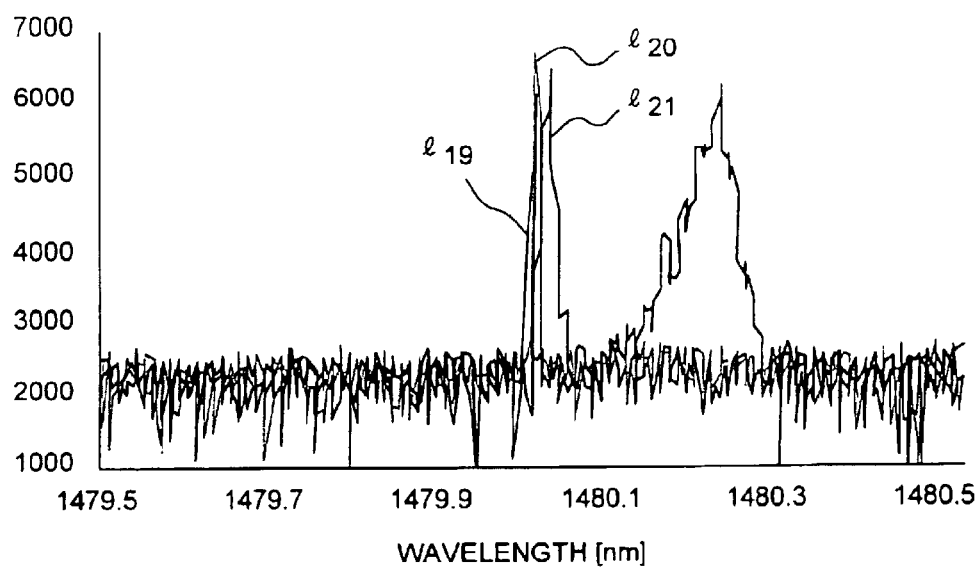
FIG. 7B is a spectrum diagram measured in the semiconductor laser device of the prior art.

FIG. 7A shows the spectrum of the semiconductor laser device to which the transmission film 9 of this embodiment is applied, and FIG. 7B shows the spectrum of the semiconductor laser device to which the transmission film having reflectivity of about 1.5% is applied. In FIG. 7A, a curved line $I_{16}$ shows a spectrum when the injection electric current I is 200 mA, a curved line $I_{17}$ shows a spectrum when I is 500 mA, and a curved line $I_{18}$ shows a spectrum when I is 900 mA. Moreover, in FIG. 7B, a curved line $I_{19}$ shows a spectrum when I is 200 mA, a curved line $I_{20}$ shows a spectrum when I is 500 mA, and a curved line $I_{21}$ shows a spectrum when I is 900 mA.

As for the whole tendency, it is found that in the semiconductor laser device to which the transmission film 9 of the first embodiment is applied, the peak intensity is strong and the half-width of the peak is narrow. The curved line $I_{18}$ and the curved line $I_{21}$ of I=900 mA which are remarkably different from each other will be compared.

The half-width of the peak waveform on the curved line $I_{21}$ is wide and forms a deformed waveform. Further, another broad peak exists in the vicinity of 1480.2 nm. On the contrary, the curved line $I_{18}$ has a peak of narrow half-width, and a peak in another wavelength does not exist.

As a result, as compared with the semiconductor laser device using the conventional transmission film, the semiconductor laser device to which the equivalent two-layer film of the first embodiment is applied has high light emission efficiency and has the narrow half-width of the peak in the oscillation wavelength. For this reason, according to the first embodiment, it is found that the semiconductor laser device, which has excellent characteristic as a signal light source or an excitation light source in optical communication, can be provided.

The transmission film composed of the equivalent two-layer film of the first embodiment can be effectively applied also to DBR laser in which the diffraction grating, not shown, is arranged inside the semiconductor laser device and the p-side electrode is not arranged above the diffraction grating. Namely, it is effective, for all semiconductor laser devices which do not use the Fabry-Perot resonator, to laminate the transmission film composed of the equivalent two-layer film of the first embodiment on the emission side end surface.

As explained above, in the semiconductor laser device of the first embodiment, the equivalent two-layer film is used for the transmission film 9. By utilizing the equivalent film structure, a substance having an arbitrary refractive index in the substances having the refractive index in the predetermined range can be used as a material of the film in order to realize the non-reflectivity two-layer film. As a result, for example, a widely used substance of which characteristic is clear such that it can withstand the long-time use, can be used. Therefore, as compared with when a special single substance is used for the second film 11 in order to realize a desirable refractive index, the durability against the long-time use of the semiconductor laser device or the like can be heightened. Moreover, as compared with when using the special material, the production cost can be made to be low, and the production can be facilitated.

In addition, the use of the equivalent two-layer film can suppress the reflectivity on the emission side end surface 15 of the semiconductor laser device in a constant wavelength range to a very low value of zero or about 0.25% or less. Therefore, this can prevent the reflection side end surface 16 and the emission side end surface 15 from forming the Fabry-Perot resonator. As a result, the half-width of the laser oscillation wavelength peak can be narrowed and the peak intensity can be increased. Further, these advantages are greater than those of the equivalent single-layer film, and the same effect which is not less than equivalent to the two-layer film not using an equivalent film is achieved.

Further, a change of the refractive index of the equivalent two-layer film with respect to an error of a thickness of a film to be laminated is small, and thus when an error occurs, the reflectivity can be suppress maximally to 0.3%, namely, a very low value. As a result, in the actual production of the semiconductor laser device, the error at the time of the lamination of the films can be allowed to a certain degree, and the yield can be improved.

In addition, in the first embodiment, the transmission film 9 as the equivalent two-layer film is composed of $Al_2O_3$ and α-Si. These substances are well known as a film material, and an apparatus which grows a film, a growing technique and the like have been already established. Therefore, use of these substances enables the film growth to be carried out easily by utilizing the conventional production technique.

In the first embodiment, the transmission film 9 has the structure that the first film 10 is composed of the single-layer film and the second film 11 is composed of the equivalent film, but it is not necessarily limited to this. More specifically, the second film 11 may be composed of the single-film and the first film 10 may be composed of the equivalent film.

Further, the transmission film 9 does not have the two-layer film structure but have a multi-layer film structure composed of three or more-layer films, arbitrary one or plural film(s) of the three films may be replaced by an equivalent film. The method of setting the reflectivity in a specified wavelength to zero by the multi-layer film structure is known, and it is known that the multi-layer film structure can realize a low reflectivity in a wide wavelength range as compared with the single-layer film structure. Therefore, when it is combined with the equivalent film structure, it is expected to realize a transmission film having low reflectivity characteristic equivalent to or more excellent than that of the multi-layer film structure of which respective layers are composed of a single film as shown similarly in the first embodiment.

Further in the first embodiment, the material of the transmission film 9 is $Al_2O_3$ and α-Si, but the material is not naturally limited to these. Since the equivalent multi-layer film structure including the equivalent two-layer film can realize a film having a desirable refractive index by a substance having an arbitrary refractive index, the transmission film 9 can be naturally composed of a substance other than $Al_2O_3$ and the like.

In addition, the emission wavelength λ of the semiconductor laser device is 1480 nm in the first embodiment, but the emission wavelength is not limited to this, and the semiconductor laser device is not limited to the structure mainly having InP. The emission wavelength λ is 1480 nm in this embodiment because the device is simply assumed to be used as an excitation light source in the erbium doped optical fiber amplifier (EDFA). Even when a semiconductor laser device of another wavelength is produced by mainly using another semiconductor, the structure of the transmission film can be determined by the above-mentioned method.

The inventors of the present invention tried to optimize the film thickness and the like of the transmission film 9 in the semiconductor laser device that emits a laser beam with a wavelength of 980 nm which is used as excitation light of EDFA. More precisely, the inventors prepared a semiconductor laser device having the transmission film 9 shown in FIG. 1 and that emits a light of wavelength of 980 nm. The first film 10 is formed with $Al_2O_3$, having refractive index $n_1$ of 1.62, and a film thickness of 67.8 nm. The second film 11 has a refractive index $n_2$ of 2.00, with a film thickness of 83.6. The second film 11 employs the equivalent film structure.

The second film 11 is comprised of a first sub-film 12, a second sub-film 13, a third sub-film 14. The first sub-film 12 is formed of $Al_2O_3$ and has a refractive index $n_{2a}$ of 1.62. The second sub-film 13 is formed of $TiO_2$ and has a refractive index $n_{2b}$ of 2.25. The third sub-film 14 is formed of $Al_2O_3$ and has a refractive index $n_{2c}$ of 1.62. The thickness of the first sub-film 12, $d_{2a}$, is 22.8 nm, the thicknesses of the second film, $d_{2b}$, is 41.3 nm, and the thicknesses of the third film, $d_{2c}$, is 22.8 nm. The reflectivity obtained due to such a structure is shown as a curve $I_{22}$ in FIG. 10. As it is apparent from the curve $I_{22}$ in FIG. 10, the reflectivity becomes 0% at the wavelength of 980 nm and it is low even in the other range.

Figure 11:
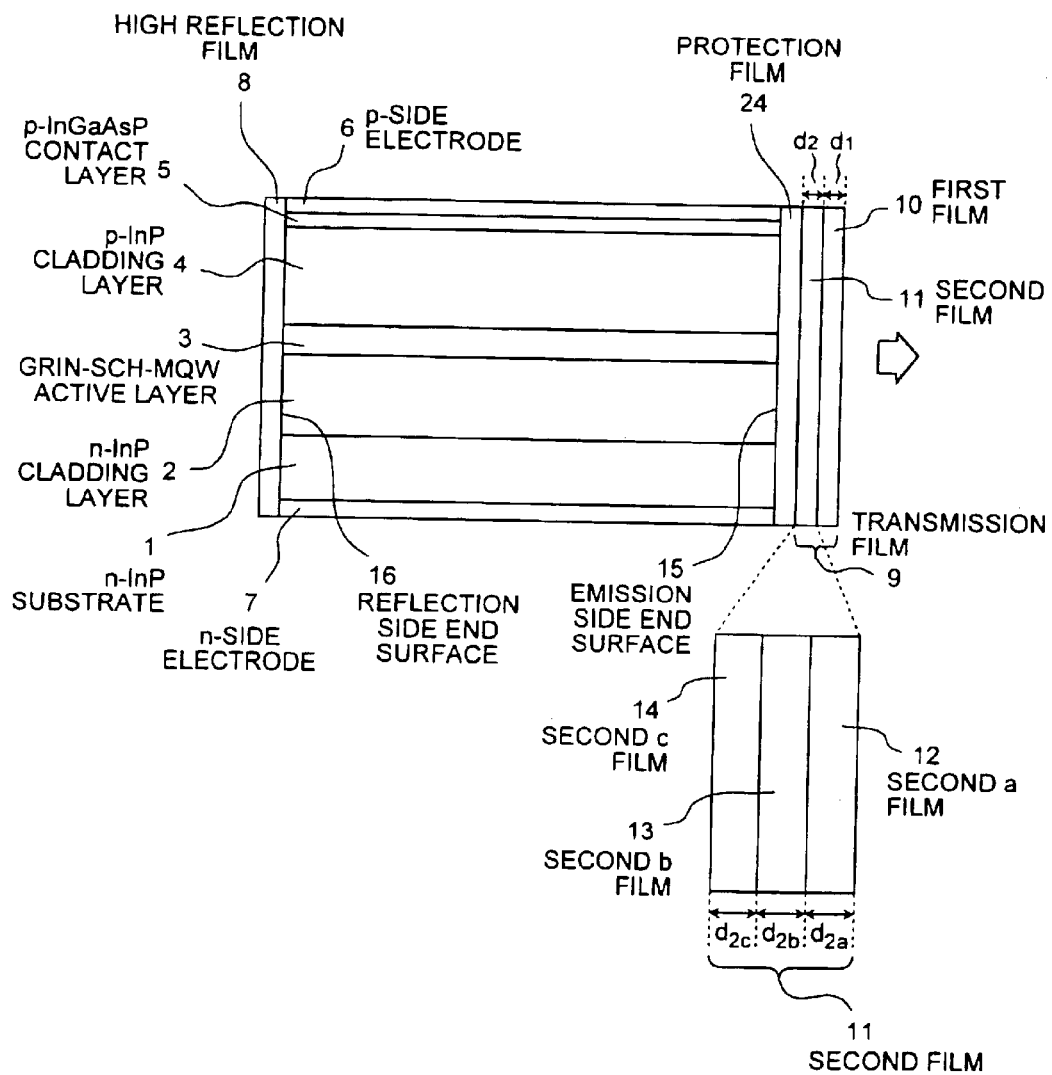
FIG. 11 is a side sectional view of an example modulated semiconductor laser device according to the first embodiment showing a structure having a protection film between an emission side end surface and a transmission film.

When the transmission film 9 is mounted on the semiconductor laser device which emits a light of wavelength of 980 nm, it is favorable to provide a protection film 24 between the emission side end surface 15 and the second film 11 as shown in FIG. 11. The protection film 24 is provided to protect the emission side end surface 15. Precisely, the protection film 24 suppresses oxidization of the emission side end surface 15 from aging, and generation of catastrophic optical damage (COD) of the emission side end surface 15.

Figure 10:
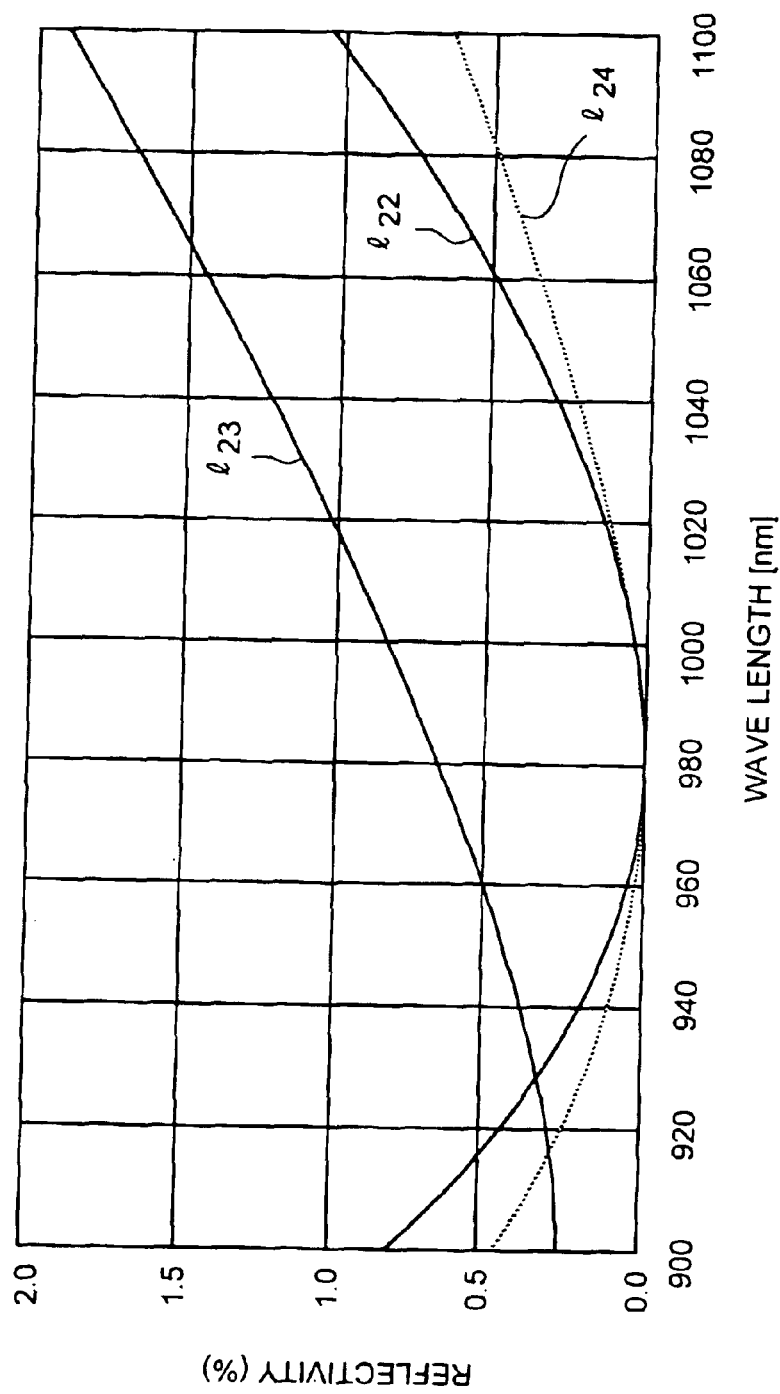
FIG. 10 is an example of modulation for the semiconductor laser device according to the first embodiment, and it is a graph which shows reflectivity changes of a wavelength when an emission wavelength is 980 nm.

Reflectivity curve when a protection film is simply provided in the structure of the transmission film 9 is shown as a curve $I_{23}$ in FIG. 10. The protection film is made of the semiconductor material InGaP. This protection film has a refractive index of 3.21 and thickness of 100 nm. The curve $I_{23}$ shows that the 0% reflectivity is shifted to short wavelength side from wavelength of 980 nm, and desired reflectivity cannot be gained in the range of 900 nm to 1100 nm.

On the contrary, when new film is provided to the emission side end surface 15, it is possible to optimize each thickness of the first film 10, the first sub-film 12, the second sub-film 13, and the third sub-film 14 by the simplex method or the anneal method. The inventors of the present invention optimized the films using the simplex method and gained the result of the thickness of the first film $d_1$ as 97.3 nm, the thickness of the first sub-film $d_{2a}$ as 17.1 nm, the thickness of the second sub-film $d_{2b}$ as 34.4 nm, and the thickness of the third sub-film $d_{2c}$ as 17.1 nm. A curve $I_{24}$ in FIG. 10 shows wavelength change of the reflectivity gained from the result above. It is apparent from the curve $I_{24}$ that even if the protection film is provided, reflectivity becomes 0% at 980 nm and also kept low in the wavelength range of 900 nm to 1100 nm. Moreover, the reflectivity of the emission side end surface 15 in optimized semiconductor laser device with the protecting film is kept low compared to the semiconductor laser device without the protecting film in the entire wavelength range of 900 nm to 1100 nm. Therefore, when the protection film is formed by InGaP, there is an advantage in terms of reflectivity suppression as well as preventing oxidization and generation of COD in the emission side end surface 15.

Second Embodiment

A second embodiment of the present invention will be explained. In the second embodiment, the semiconductor laser device shown in the first embodiment is used in a laser module.

Figure 12:
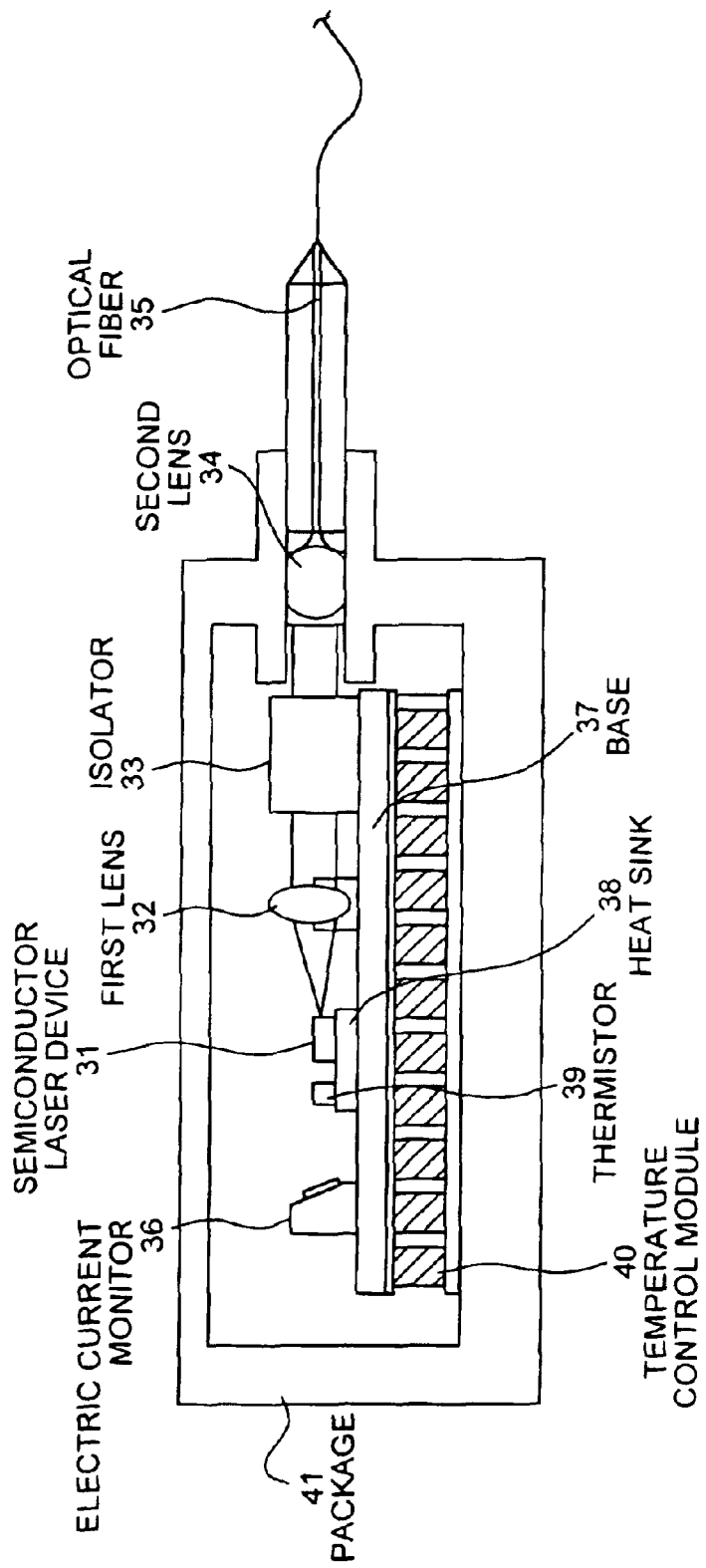
FIG. 12 is a side sectional view which shows a structure of the semiconductor laser module according to the second embodiment.

FIG. 12 is a side sectional view which shows a structure of the semiconductor laser module according to the second embodiment of the present invention. The semiconductor laser module of the second embodiment has a semiconductor laser device 31 corresponding to the semiconductor laser device shown in the first embodiment. The semiconductor laser device 31 has a junction-down structure that the p-side electrode is jointed to a heat sink 38. A temperature control module 40 as a temperature control unit is arranged on an internal bottom surface of a package 41 which is formed as a housing of the semiconductor laser module by ceramic or the like. A base 37 is arranged on the temperature control module 40, and a heat sink 38 is arranged on the base 37. An electric current, not shown, is supplied to the temperature control module 40, cooling or heating is carried out according to polarity of the electric current. However, in order to prevent the oscillation wavelength from deviating due to a rise of the temperature of the semiconductor laser device 31, the temperature control module 40 functions mainly as a cooler. When a laser beam has a longer wavelength than a desired wavelength, the temperature control module 40 cools and controls to a low temperature, and when a laser beam has a shorter waveform than the desired wavelength, the temperature control module 40 heats and controls to a high temperature. Specifically, this temperature control is carried out based on a detected value of a thermistor 39 which is arranged on the heat sink 38 in the vicinity of the semiconductor laser device 31, and a control unit, not shown, normally controls the temperature control module 40 so that the temperature of the heat sink 38 is kept constant. Moreover, the control unit, not shown, controls the temperature control module 40 so that the temperature of the heat sink 38 drops as a driving current of the semiconductor laser device 31 is raised. When such a temperature control is carried out, output stability of the semiconductor laser device 31 can be improved, and the yield is also improved effectively. It is desirable that the heat sink 38 is formed by a substance having high thermal conductivity such as diamond. This is because when the heat sink 38 is formed by diamond, heat generation at the time of applying a high electric current is suppressed.

The heat sink 38 on which the semiconductor laser device 31 and the thermistor 39 are arranged, a first lens 32 and an electric current monitor 36 are arranged on the base 37. A laser beam emitted from the semiconductor laser device 31 is guided via the first lens 32, an isolator 33 and a second lens 34 onto an optical fiber 35. The second lens 34 is on an optical axis of the laser beam and is provided on the package 41 and is optically coupled with the optical fiber 35 to be externally connected. The electric current monitor 36 detects a light leaked from a high reflectivity film side of the semiconductor laser device 31.

In this semiconductor laser module, the isolator 33 intervenes between the semiconductor laser device 31 and the optical fiber 35 so that a reflected return light from other optical parts do not return into the resonator. When the semiconductor laser device 31 has the structure as shown in FIGS. 7 and 8, a polarization nondependent type isolator which can be contained in the semiconductor laser module can be used as the isolator 33. For this reason, insertion loss due to the isolator is small and a low relative intensity noise (RIN) can be achieved, and further number of parts can be reduced.

In addition, when the semiconductor laser device 31 has the structure as shown in FIG. 1, a fiber grating is arranged into the optical fiber 35, so that the reflection side end surface 16 and the resonator of the semiconductor laser device 31 are formed. When it is so, the isolator 33 is not arranged in the semiconductor laser module but should be of an in-line type.

The semiconductor laser module of the second embodiment utilizes the semiconductor laser device of the first embodiment, and this provides a semiconductor laser module having high light emission efficiency in which the semiconductor laser device 31 does not form a Fabry-Perot resonator by the emission side end surface 15 and the reflection side end surface 16, and a peak half-width of the laser beam to be emitted is narrow. Such a semiconductor laser module is suitable to be used as a signal light source or an excitation light source in an optical communication system. When it is used as an excitation light source, an optical fiber amplifier to be used may adopt EDFA, Raman amplification or other systems.

As explained above, according to the present invention, an arbitrary one layer of the multi-layer film structure has an equivalent film structure, so that the reflectivity in the wavelength deviating from a laser beam by a constant range is lower than when non-reflectivity is realized by the single-layer film, and thus there is an effect that an influence of the Fabry-Perot resonator can be suppressed.

In addition, according to the present invention, non-reflectivity can be realized by the transmission film composed of a simple structure of the two-layer film, and the equivalent film is used, and thus there is an effect that the reflectivity of a light of which constant range wavelength deviates from the laser beam can be suppressed to an equivalent or lower value as compared with the two-layer film in which the respective layers are composed of a single film.

Further, according to the present invention, since the second film is replaced by the equivalent film composed of the third film, the fourth film and the fifth film, there is an effect that the reflectivity of a light of which wavelength deviates from a laser beam by a constant range on the emission side end surface can be suppressed to an equivalent or lower value as compared with the two-layer film simply composed of two films.

Further, according to the present invention, since the fifth film arranged adjacently to the first film is made of the same optical material as the first film, there is an effect that when the transmission film is laminated, the first film and the fifth film can be produced by a sequential step.

Further, according to the present invention, since the fifth film and the third film are formed by the same optical material, there is an effect that the equivalent film composed of the third film, the fourth film and the fifth film has a symmetrical structure with respect to the center surface.

Further, according to the present invention, since the device is provided with the side surface protection film, oxidization and generation of COD in the emission side end surface is suppressed.

Further, according to the present invention, since the side surface protection film is formed by InGaP, adhesiveness between the semiconductor material, which forms the active film, and the side surface protection film is improved. By optimizing multi-layer film including the side surface protection film, low reflectivity is realized in a wide wavelength range.

Further, according to the present invention, since the refractive index is specifically determined, there is an effect that optical materials of the equivalent film composing the second film and the first film can be selected easily.

Further, according to the present invention, since the refractive index of the second film is set to be equal to or more than 2.50 and less than 2.92, there is an effect that the reflectivity due to the lamination error between the first and second films can be suppressed to be low.

Further, according to the present invention, since the materials of the films are alumina and amorphous silicon, there is an effect that the equivalent two-layer film having high reliability which is capable of withstanding the long-time use as the transmission film of the semiconductor laser device can be realized.

Further, according to the present invention, since the material used for forming a film is alumina or titanium oxide, equivalent two-layer film, which has high reliability as a transmission film of a semiconductor laser device, is realized.

Further, according to the present invention, since reflectivity of the multi-layer film is below 0.5% in a wavelength range where the difference with the laser beam wavelength is below 100 nm, an optical output can be suppressed almost the same as in the case when no wavelength is changed even if a wavelength of the emitted laser beam is changed from originally designed value.

Further, according to the present invention, since reflectivity of the multi-layer film is below 0.2% in a wavelength range where the difference with the laser beam wavelength is below 100 nm, an optical output can be maintained almost the same as in the case when no wavelength is changed even if a wavelength of the emitted laser beam is changed from originally designed value.

Further, according to the present invention, since the above-mentioned semiconductor laser device is used, there is an effect that a laser beam of which half-width of the peak is narrow can be emitted.

Further, according to the present invention, since the optical detector is provided, a light output can be monitored and the light output can be stabilized, and there is an effect that a light can be prevented from being reflected from the outside by providing the isolator.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor laser device comprising:
   an active layer positioned between cladding layers, said active layer having
   a reflection side end surface configured to reflect an oscillated laser beam, and an emission side end surface configured to emit the laser beam; and
   a transmission film comprising a multi-layer film laminated on said emission side end surface, said transmission film having a low reflectivity of 0.5% or less within a wavelength range defined by a predetermined wavelength difference with respect to a predetermined oscillation wavelength, wherein:
   at least one film of said multi-layer film includes plural sub-films that collectively are optically equivalent to a single layer film, and
   the at least one film inclues an outer sub-film made of the same material as another film of the multilayer film which is adjacent to the outer sub-film.

2. The semiconductor laser device of claim 1, wherein said multi-layer film is a two-layer film.

3. The semiconductor laser device of claim 2, wherein:
   said two-layer film comprises a second film positioned on said emission side end surface, and a first film positioned on said second film; and
   said second film comprises a third sub-film laminated to contact with said emission side end surface, a fourth sub-film laminated to contact with said third sub-film and a fifth sub-film laminated to contact with said fourth sub-film.

4. The semiconductor laser device of claim 3, wherein said first film is positioned to contact with said fifth sub-film, said first film being made of the same optical material as said fifth sub-film.

5. The semiconductor laser device according to claim 3, wherein said fifth sub-film is made of the same optical material as said third sub-film.

6. The semiconductor laser device according to claim 5, wherein the third sub-film and the fifth sub-film are substantially equal in thickness.

7. The semiconductor laser device of claim 3, wherein a refractive index of at least a laser beam emission section on said emission side end surface for the laser beam is about 3.25, a refractive index of said first film for the laser beam is about 1.62, and a refractive index of said second film for the laser beam is no less than 2.50 and no more than 2.92.

8. The semiconductor laser device of claim 3, wherein said first film, said third sub-film, and said fifth sub-film are made of alumina, and said fourth sub-film is made of amorphous silicon.

9. The semiconductor laser device of claim 3, wherein said first film, said third sub-film, and said fifth sub-film are made of alumina, and said fourth sub-film is made of titanium oxide.

10. The semiconductor laser device of claim 2, wherein a refractive index of at least a laser beam emission section on said emission side end surface for the laser beam is no less than 3 and no more than 4, and a refractive index of said first film for the laser beam is no less than 1.1 and no more than 1.9, and a refractive index of said second film for the laser beam is no less than 1.90 and no more than 3.79.

11. The semiconductor laser device of claim 1, further comprising a side surface protection layer provided between said emission side end surface and said multi-layer film.

12. The semiconductor laser device of claim 11, wherein said side surface protection layer is formed of InGaP.

13. A semiconductor laser device comprising:
an active layer positioned between cladding layers, said active layer having a reflection side end surface configured to reflect an oscillated laser beam, and an emission side end surface configured to emit the laser beam; and
a multi-layer film disposed on said emission side end surface and having a reflectivity of almost zero for said laser beam, said multi-layer film having a reflectivity that is no more than 0.4% for a light which has a wavelength difference of no more than 100 nm with respect to a predetermined oscillation wavelength, wherein said multi-layer film includes a sub-film.

14. The semiconductor laser device of claim 13, wherein said multi-layer film has a reflectivity that is no more than 0.2% for a light which has a wavelength difference of no more than 100 nm with respect to the predetermined oscillation wavelength.

15. A semiconductor laser module comprising:
a semiconductor laser device including
an active layer disposed between cladding layers, said active layer having a reflection side end surface configured to reflect an oscillated laser beam, and an emission side end surface configured to emit the laser beam;
a transmission film including a multi-layer film laminated on said emission side end surface, said transmission film having a low reflectivity of 0.5% or less within a wavelength range defined by a predetermined wavelength difference with respect to a predetermined oscillation wavelength, and at least one film of said multi-layer film including plural sub-films that collectively are optically equivalent to a single layer film;
a temperature control module configured to control a temperature of said semiconductor laser device;
an optical fiber configured to guide the laser beam emitted from said semiconductor laser device outside; and
an optically coupling lens system configured to optically couple said semiconductor laser device with said optical fiber.

16. The semiconductor laser module of claim 15, further comprising:
an optical detector configured to measure a light output of said semiconductor laser device; and
an isolator configured to suppress incidence of a light reflected from said optical fiber.

17. A semiconductor laser module comprising:
a semiconductor laser device including
an active layer positioned between cladding layers, said active layer having a reflection side end surface configured to reflect an oscillated laser beam and an emission side end surface configured to emit the laser beam, and
a multi-layer film disposed on said emission side end surface and having a reflectivity of almost zero for said laser beam, said multi-layer film having a reflectivity that is no more than 0.4% for a light which has a wavelength difference of no more than 100 mn with respect to a predetermined oscillation wavelength;
a temperature control module configured to control a temperature of said semiconductor laser device;
an optical fiber configured to guide the laser beam emitted from said semiconductor laser device outside; and
an optically coupling lens system configured to optically couple said semiconductor laser device with said optical fiber, said multi-layer film including a sub-film.

18. The semiconductor laser module according to claim 17, further comprising:
an optical detector configured to measure a light output of said semiconductor laser device; and
an isolator configured to suppress incidence of a light reflected from said optical fiber.

19. A method of manufacturing a semiconductor laser device comprising steps of:
forming an active layer that is positioned between cladding layers, said active layer having
a reflection side end surface configured to reflect an oscillated laser beam,
an emission side end surface configured to emit the laser beam;
forming a transmission film comprising a multi-layer film laminated on said emission side end surface, said transmission film having a low reflectivity of 0.5% or less within a wavelength range defined by a predetermined wavelength difference with respect to a predetermined oscillation wavelength, said transmission film having a structure of plural films, wherein:
at least one film of said multi-layer film includes plural sub-films that collectively are optically equivalent to a single layer film, and
the at least one film includes an outer sub-film made of the same material as another film of the multilayer film which is adjacent to the outer sub-film.

20. A method of manufacturing a semiconductor laser device comprising steps of:
forming an active layer between cladding layers, said active layer having,
a reflection side end surface configured to reflect an oscillated laser beam,
an emission side end surface configured to emit the laser beam; and
forming a multi-layer film on said emission side end surface having a reflectivity of almost zero for said laser beam, said multi-layer film having a reflectivity that is no more than 0.4% for a light which has a wavelength difference of no more than 100 nm with respect to a predetermined oscillation wavelength, wherein
said multi-layer film includes a sub-film.

21. A method of manufacturing a semiconductor laser device comprising steps for:
- forming an active layer between cladding layers, said active layer having
  - a reflection side end surface for reflecting an oscillated laser beam,
  - an emission side end surface for emitting the laser beam; and
- forming a transmission film comprising a multi-layer film laminated on said emission side end surface, said transmission film having a low reflectivity of 0.5% or less within a wavelength range defined by a predetermined wavelength difference with respect to a predetermined oscillation wavelength, wherein:
- at least one film of said multi-layer film includes plural sub-films that collectively are optically equivalent to a single layer film, and
- the at least one film includes an outer sub-film made of the same material as another film of the multilayer film which is adjacent to the outer sub-film.

22. A semiconductor laser device comprising:
- an active layer positioned between cladding layers, said active layer having a reflection side end surface configured to reflect an oscillated laser beam, and an emission side end surface configured to emit the laser beam; and
- a multi-layer film disposed on said emission side end surface,
- wherein said multi-layer film has a reflectivity profile having reflectivity of no more than 0.4% greater than a minimum reflectivity within a wavelength range defined by a wavelength difference of 100 nm with respect to a predetermined oscillation wavelength, said multi-layer film includes a sub-film.

23. The semiconductor laser device of claim 22, wherein said multi-layer film has a reflectivity profile having reflectivity of no more than 0.2% greater than a minimum reflectivity within a wavelength range defined by a wavelength difference of 100 mu with respect to the predetermined oscillation wavelength.

24. A semiconductor laser module comprising:
- a semiconductor laser device including
  - an active layer positioned between cladding layers, said active layer having a reflection side end surface configured to reflect an oscillated laser beam, and an emission side end surface configured to emit the laser beam, and
  - a multi-layer film disposed on said emission side end surface, said multi-layer film having a reflectivity profile having reflectivity of no more than 0.4% greater than a minimum reflectivity within a wavelength range defined by a wavelength difference of 100 nm with respect to a predetermined oscillation wavelength;
- a temperature control module configured to control a temperature of said semiconductor laser device;
- an optical fiber configured to guide the laser beam emitted from said semiconductor laser device outside; and
- an optically coupling lens system configured to optically couple said semiconductor laser device with said optical fiber, wherein
- said multi-layer film includes a sub-film.

25. The semiconductor module according to claim 24, further comprising:
- an optical detector configured to measure a light output of said semiconductor laser device; and
- an isolator configured to suppress incidence of a light reflected from said optical fiber.

26. A semiconductor laser device comprising:
- an active layer positioned between cladding layers, said active layer having a reflection side end surface configured to reflect an oscillated laser beam and an emission side end surface configured to emit the laser beam; and
- a multi-layer film laminated on the emission side end surface and having a low reflectivity of 0.5% or less within a wavelength range defined by a predetermined wavelength difference with respect to a predetermined oscillation wavelength, wherein:
- at least one film of said multi-layer film further includes plural sub-films which are substantially symmetrically laminated with respect to a center plane in a direction of lamination of the plural sub-films, and
- the at least one film includes an outer sub-film made of the same material as another film of the multilayer film which is adjacent to the outer sub-film.

27. The semiconductor laser device of claim 26,
wherein said multi-layer film is a two-layer film including a first film and a second film positioned between the first film and the emission side end surface of said active layer, and
wherein the second film further includes a plural sub-films which are substantially symmetrically laminated with respect to a center plane in a direction of lamination of the plural sub-films.

28. The semiconductor laser device of claim 27, wherein the second film includes a third sub-film laminated to contact with the emission side end surface, a fourth sub-film laminated to contact with the third sub-film and a fifth sub-film laminated to contact with the fourth sub-film.

29. The semiconductor laser device of claim 28, wherein the first film is positioned to contact with the fifth sub-film, and wherein the first film is made of the same optical material as the fifth sub-film.

30. The semiconductor laser device according to claim 28, wherein the fifth sub-film is made of the same optical material as the third sub-film.

31. The semiconductor laser device according to claim 30, wherein the third sub-film and the fifth sub-film are substantially equal in thickness.

32. The semiconductor laser device of claim 28,
wherein the first film, the third sub-film, and the fifth sub-film are made of alumina; and
wherein the fourth sub-film is made of amorphous silicon.

33. The semiconductor laser device of claim 28,
wherein the first film, the third sub-film, and the fifth sub-film are made of alumina; and
wherein the fourth sub-film is made of titanium oxide.

34. The semiconductor laser device of claim 27,
wherein a refractive index for the laser beam of at least a laser beam emitting section on the emission side end surface is no less than 3 and no more than 4;
wherein a refractive index for the laser beam of the first film is no less than 1.1 and no more than 1.9; and
wherein a refractive index for the laser beam of the second film is no less than 1.90 and no more than 3.79.

35. The semiconductor laser device of claim 27,
wherein a refractive index for the laser beam of at least a laser beam emitting section on the emission side end surface is about 3.25;
wherein a refractive index for the laser beam of the first film is about 1.62; and wherein a refractive index for the laser beam of the second film is no less than 2.50 and no more than 2.92.

36. The semiconductor laser device of claim 26, further comprising a side surface protection layer provided between the emission side end surface and said multi-layer film.

37. The semiconductor laser device of claim 36, wherein said side surface protection layer is formed of InGaP.

38. A semiconductor laser module comprising:
   a semiconductor laser device including
      an active layer disposed between cladding layers, the active layer having a reflection side end surface configured to reflect an oscillated laser beam and an emission side end surface configured to emit the laser beam, and
      a multi-layer film laminated on the emission side end surface and having a low reflectivity of 0.5% or less within a wavelength range defined by a predetermined wavelength difference with respect to a predetermined oscillation wavelength, at least one film of the multi-layer film including plural sub-films which are substantially symmetrically laminated with respect to a center plane in a direction of lamination of the plural sub-films;
   a temperature control module configured to control a temperature of said semiconductor laser device;
   an optical fiber configured to guide the laser beam emitted from said semiconductor layer device outside; and
   an optically coupling lens system configured to optically couple said semiconductor laser device with said optical fiber.

39. The semiconductor laser module of claim 38, further comprising:
   an optical detector configured to measure a light output of said semiconductor laser device; and
   an isolator configured to suppress incidence of a light reflected from said optical fiber.

40. A method of manufacturing a semiconductor laser device comprising steps of:
   forming an active layer between cladding layers, said active layer having a reflection side end surface configured to reflect an oscillated laser beam and an emission side end surface configured to emit the laser beam; and
   laminating a multi-layer film on the emission side end surface, said multilayer film having a low reflectivity of 0.5% or less within a wavelength range defined by a predetermined wavelength difference with respect to a predetermined oscillation wavelength, wherein:
   said laminating the multi-layer film includes laminating at least one film by laminating plural sub-films so that the plural sub-films are substantially symmetric with respect to a center plane in a direction of the laminating the plural sub-films, and
   the at least one film includes an outer sub-film made of the same material as another film of the multilayer film which is laminated to the outer sub-film.

41. A method of manufacturing a semiconductor laser comprising:
   steps for forming an active layer between cladding layers, the active layer having a reflection side end surface for reflecting an oscillated laser beam and an emission side end surface for emitting the laser beam; and
   said step for laminating a multi-layer film on the emission side end surface, said multilayer film having a low reflectivity of 0.5% or less within a wavelength range defined by a predetermined wavelength difference with respect to a predetermined oscillation wavelength, wherein
   said step for laminating the multi-layer film includes laminating at least one film by laminating plural sub-films so that the plural sub-films are substantially symmetric with respect to a center plane in a direction of lamination of the plural sub-films, and
   the at least one film includes an outer sub-film made of the same material as another film of th mulitlayer film which is laminated to the outer sub-film.

42. A method of designing a semiconductor laser device comprising the steps of:
   determining multi-layer film to be laminated on an emission side end surface of the semiconductor laser device, such that the multi-layer film has a low reflectivity of 0.5% or less within a wavelength range defined by a predetermined wavelength difference with respect to a predetermined oscillation wavelength; and
   determining plural sub-films to be substituted for one film of the multi-layer film, such that the plural sub-films are optically equivalent to the one film, wherein the one film includes an outer sub-film made of the same material as another film of the multilayer film which is adjacent to the outer sub-film.

43. The method of claim 42, wherein said determining plural sub-films includes determining plural sub-films such that the plural sub-films are symmetric with respect to a center plane in a direction of lamination thereof.

44. The method of claim 42, wherein said determining plural sub-films includes determining plural sub-films such that the multi-layer film has a reflectivity not larger than a predetermined value within a wavelength range defined by a predetermined deviation from the wavelength of light emitted from the semiconductor laser device.

45. A semiconductor laser device comprising:
   an active layer positioned between cladding layers, said active layer having a reflection side end surface configured to reflect an oscillated laser beam, and an emission side end surface configured to emit the laser beam; and
   a transmission film having a low reflectivity of 0.5% or less within a wavelength range defined by a predetermined wavelength difference with respect to a predetermined oscillation wavelength, the transmission film comprising:
   a second film positioned on said emission side end surface and including a first sub-film laminated to contact with said emission side end surface, a second sub-film laminated to contact with said first sub-film and a third sub-film laminated to contact with said second sub-film, wherein said first and third sub-films have an optical thickness smaller than one quarter of said predetermined oscillation wavelength and the sub-films collectively are optically equivalent to a single layer film, and
   a first film positioned on said second film of said transmission film.

* * * * *